United States Patent
Ahn

(10) Patent No.: US 10,817,765 B2
(45) Date of Patent: Oct. 27, 2020

(54) SEMICONDUCTOR DEVICE AND CONTROLLER FOR ASYNCHRONOUS SERIAL COMMUNICATION, AND ASYNCHRONOUS SERIAL COMMUNICATION METHOD AND SYSTEM

(71) Applicant: DUALITY INC., Seongnam-si, Gyeonggi-do (KR)

(72) Inventor: Jin Hong Ahn, Yongin-si (KR)

(73) Assignee: DUALITY INC., Seongnam-si, Gyeonggi-Do (KR)

(*) Notice: Subject to any disclaimer, the term of this patent is extended or adjusted under 35 U.S.C. 154(b) by 258 days.

(21) Appl. No.: 15/756,615

(22) PCT Filed: Aug. 19, 2016

(86) PCT No.: PCT/KR2016/009207
§ 371 (c)(1),
(2) Date: Mar. 1, 2018

(87) PCT Pub. No.: WO2017/039203
PCT Pub. Date: Mar. 9, 2017

(65) Prior Publication Data
US 2018/0276516 A1 Sep. 27, 2018

(30) Foreign Application Priority Data

Sep. 1, 2015 (KR) .................. 10-2015-0123398
Sep. 1, 2015 (KR) .................. 10-2015-0123399
Sep. 1, 2015 (KR) .................. 10-2015-0123400

(51) Int. Cl.
*G06K 19/07* (2006.01)
*G11C 5/06* (2006.01)
(Continued)

(52) U.S. Cl.
CPC ..... *G06K 19/0701* (2013.01); *G06K 19/0716* (2013.01); *G11C 5/066* (2013.01);
(Continued)

(58) Field of Classification Search
CPC .......... G06K 19/0701; G06K 19/0716; G11C 5/066; G11C 7/22; G11C 7/10;
(Continued)

(56) References Cited

U.S. PATENT DOCUMENTS 5,398,326 A 3/1995 Lee
6,108,751 A 8/2000 Lee et al.
(Continued)

FOREIGN PATENT DOCUMENTS

JP 2000-091902 3/2000
JP 2003-050776 2/2003
(Continued)

OTHER PUBLICATIONS

International Search Report for International Application No. PCT/KR2016/009207, dated Jan. 18, 2017.
(Continued)

*Primary Examiner* — Ajay Ojha
(74) *Attorney, Agent, or Firm* — Kile Park Reed & Houtteman PLLC

(57) ABSTRACT

The present invention discloses an asynchronous serial communication system and method. The asynchronous serial communication system may include a semiconductor device having two terminals and configured to receive a voltage required for an operation from data transmitted through one terminal; and a controller configured to perform asynchronous serial communication with the semiconductor device with two terminals. The asynchronous serial communication system may perform asynchronous serial com-
(Continued)

munication between the semiconductor device and the controller in order to write or read data through the one terminal.

10 Claims, 16 Drawing Sheets

(51) Int. Cl.
  *G11C 7/10* (2006.01)
  *G11C 7/22* (2006.01)
  *G08C 19/28* (2006.01)

(52) U.S. Cl.
  CPC .......... *G11C 7/10* (2013.01); *G11C 7/22* (2013.01); *G08C 19/28* (2013.01); *G11C 7/1057* (2013.01); *G11C 7/1066* (2013.01); *G11C 7/1084* (2013.01); *G11C 7/1093* (2013.01)

(58) Field of Classification Search
  CPC ... G11C 7/1093; G11C 7/1066; G11C 7/1057; G11C 7/1084; G08C 19/28
  See application file for complete search history.

(56) References Cited

U.S. PATENT DOCUMENTS

| | | | | |
|---|---|---|---|---|
| 2010/0262733 | A1* | 10/2010 | Gaskins | G06F 13/4086 710/105 |
| 2016/0155678 | A1* | 6/2016 | Ahn | G01R 27/02 702/65 |
| 2017/0255250 | A1* | 9/2017 | Ngo | G06F 13/404 |
| 2017/0287535 | A1* | 10/2017 | Lee | G11C 29/028 |

FOREIGN PATENT DOCUMENTS

| | | |
|---|---|---|
| JP | 2009-278603 | 11/2009 |
| JP | 2011-124683 | 6/2011 |
| KR | 10-1492861 | 2/2015 |

OTHER PUBLICATIONS

Written Opinion with English translation for International Application No. PCT/KR2016/009207, dated Jan. 18, 2017.

* cited by examiner

SEMICONDUCTOR DEVICE AND CONTROLLER FOR ASYNCHRONOUS SERIAL COMMUNICATION, AND ASYNCHRONOUS SERIAL COMMUNICATION METHOD AND SYSTEM

TECHNICAL FIELD

The present disclosure relates to asynchronous serial communication, and more particularly, to a semiconductor device for asynchronous serial communication, and an asynchronous serial communication method and system for performing asynchronous serial communication to write and read data.

BACKGROUND ART

Semiconductor devices can be fabricated through various semiconductor technologies, depending on the uses thereof.

For example, a semiconductor device such as a semiconductor memory or system integrated circuit is fabricated through a semiconductor technology capable of satisfying high performance and high degree of integration. In this case, the fabrication cost of the semiconductor device is inevitably high.

On the other hand, there are also semiconductor devices which can be fabricated at a low cost. Examples of the semiconductor devices which can be fabricated at a low cost may include a security chip, a medical sensor for single use, an environmental sensor, a small precise sensor for industrial use and the like. The above-described semiconductor technologies may be exemplified as disclosed in U.S. Pat. Nos. 5,398,326 and 6,108,751.

The semiconductor devices related to the sensor field, such as a medical sensor for single use and a security chip, do not require high performance, have low power consumption and small size, and require a simple interface with an external system.

The semiconductor device utilized as a sensor should have price competitiveness. Furthermore, the semiconductor device utilized as a sensor should be able to have a simple structure, and guarantee a favorable data transmission speed while having various utilizations.

DISCLOSURE

Technical Problem

Various embodiments are directed to a semiconductor device with two terminals of which one terminal is shared for data communication and power source.

Also, various embodiments are directed to a semiconductor device having a rectification function for acquiring a supply voltage from data.

Further, various embodiments are directed to a technique capable of writing and reading data through one pin using an asynchronous serial communication method.

Further, various embodiments are directed to a technique capable of enabling a semiconductor device with two pins to generate a reference clock for asynchronous serial communication and to write data provided from an external controller using the reference clock, and a technique for minimizing an energy loss and the sizes of internal circuits in order to transmit data information generated therein to the external controller.

Further, various embodiments are directed to a controller capable of transferring data using a short period pulse in order to raise the efficiency of a rectification function using input data, a semiconductor device capable of stably recovering data transferred through a short period pulse, and an asynchronous serial communication technology capable of preventing an error during a data transfer process.

Further, various embodiments are directed to a technique for performing asynchronous serial communication, and determining read and write modes according to code information contained in data.

Further, various embodiments are directed to a technique for generating a timing for determining a high or low state of data inputted through an asynchronous serial communication method in a write mode, recognizing the baud rate of the input data.

Further, various embodiments are directed to a technique for generating a clock signal corresponding to a same baud rate when a series of data transmitted from outside contains a code indicating a read mode, sensing internal data from an internal data forming unit using the generated clock signal, the internal data forming unit indicating an element array including at least one of a sensor element and memory element which are implemented with a CMOS circuit, performing data communication with an external controller by transferring the sensed data to an output buffer, and returning to a write mode after all the data are transferred to the external controller at read mode.

Further, various embodiments are directed to a technique for generating an output of a semiconductor device with two terminals in synchronization with a reference pulse signal transmitted from an external controller in a read mode, such that the output of the semiconductor device with two terminals can be sensed and determined by the external controller.

Further, various embodiments are directed to a technique for alternately performing an operation of transmitting data from a data forming unit to an output buffer and an operation of transmitting data from the output buffer to the outside, in order to reduce the size of the output buffer required by a semiconductor device with two terminals when the semiconductor device outputs data.

Further, various embodiments are directed to a technique for sharing one terminal selected between two terminals of a semiconductor device for data communication and power source, depending on a mode.

Technical Solution

In one embodiment, a semiconductor device may include: first and second terminals on a substrate; a rectification circuit including a diode and a first capacitor; and a CMOS component. Any one of the first and second terminals may be connected to a contact for data I/O of the CMOS component, and simultaneously connected to the rectification circuit, the semiconductor device may be operated by power stored in the first capacitor, and the data I/O may use a pulse signal synchronized with a data transition time point in order to increase power supply efficiency.

In the semiconductor device, an element array including at least one of a sensor element and memory element which are implemented with the CMOS component may be formed on a sensing surface of the substrate, and the semiconductor device may further include a circuit for processing the data for the element array.

In another embodiment, a semiconductor device may include an input buffer configured to recognize a pulse signal synchronized with a transition point of an actual signal provided from outside through one I/O line; a pulse signal recovery circuit configured to recover the recognized pulse signal to the actual signal; a command decoder configured to recognize the recovered signal as data; an address providing unit configured to provide write addresses in response to a write mode according to control of the command decoder; and an element array including at least one of a sensor element and memory element for writing the data according to the addresses.

In another embodiment, a semiconductor device may include an input buffer configured to recognize a pulse signal provided from outside through one I/O line; a pulse signal recovery circuit configured to recover the recognized pulse signal to an actual signal; a command decoder configured to recognize a read mode code of the recovered signal and provide a read command; an address providing unit configured to provide read addresses in response to a read mode; an element array configured to provide the data in response to the read command and the designated addresses; an analog-digital converter (ADC) configured to convert an analog signal outputted from the element array into a digital signal; a first-in first-out (FIFO) memory configured to sequentially store and output predetermined sizes of data outputted from the ADC; and an output buffer configured to output the data of the FIFO memory through the I/O line.

In another embodiment, a controller may include: a voltage regulator configured to generate a stable voltage required for an operation of a semiconductor device with two terminals; a command decoder configured to provide data corresponding to a signal transmitted from outside; a baud rate generator configured to generate a capture timing of data provided from the semiconductor device with two terminals; a pulse signal generator configured to provide a pulse signal for loading the data of the command decoder to one I/O line according to the capture timing; an output buffer configured to output the pulse signal of the pulse signal generator to the semiconductor device through the one I/O line, using the voltage of the voltage regulator; an input buffer configured to receive a signal from the semiconductor device through the one I/O line; and a converter configured to convert the signal of the input buffer into a data format recognizable by an external device.

In another embodiment, an asynchronous serial communication method may include: generating an oscillation signal by recognizing a pulse width of one bit among the first bit and a plurality of data bits following the first bit, which are transmitted through an asynchronous serial communication method, using a ring oscillater; generating a capture signal based on a transition point of the oscillation signal; and capturing the data bit using any one of rising and falling edges of the capture signal.

In another embodiment, an asynchronous serial communication system may include: a controller having a first output buffer and first input buffer which share one I/O line; and a semiconductor device having a second output buffer and second input buffer which share the one I/O line, and including a capacitor for storing power and a diode for transferring data of the I/O line to the capacitor. When the controller writes the data to the semiconductor device, the first output buffer may be retained in an on state, and the second output buffer may be retained in an off state. The data may be transferred to the capacitor through the diode while being transferred to the second input buffer. When the controller reads the data from the semiconductor device, the first output buffer may be turned off while the second output buffer is retained in the on state.

In another embodiment, an asynchronous serial communication system may include: a controller configured to control pull-up and pull-down operations for an I/O line, and output a pulse signal to the I/O line, the pulse signal swinging between an I/O voltage for controlling the pull-up operation and a reference voltage for controlling the pull-down operation and corresponding to a transition time point of a signal transmitted from outside; and a semiconductor device configured to perform charging of an internal power source and write modes using the signal of the I/O line which is pulsed.

In another embodiment, a controller may include: a pulse generator configured to generate a pulse corresponding to a transition point of a transmitted signal when the transmitted signal is inputted; a voltage regulator configured to maintain a pull-up operation such that an I/O line retains a preset I/O voltage or more; and a pull-down controller configured to pull down the I/O line in response to a pulse signal of the pulse generator, and stop the pull-down operation when the voltage of the I/O line reaches a preset reference voltage. The voltage level of the I/O line may be restored by the pull-up operation after the pull-down operation is stopped, and the pulse signal which is swung by the pull-up and pull-down operations may be outputted to the I/O line in response to the transmitted signal.

In another embodiment, a semiconductor device may include: an input buffer configured to receive a pulse signal from a controller through an I/O line in response to a transition point of a signal transmitted from outside, the pulse signal swinging between first and second voltages, compare the pulse signal to a preset comparison voltage, and provide a signal corresponding to a comparison result between the pulse signal and the comparison voltage; a pulse generation circuit configured to output a pulse having a transition point synchronized with an output of the input buffer; and a toggle flip-flop configured to recover the data to have the same phase as the transmitted signal using the pulse.

In another embodiment, a controller may include: an I/O voltage regulator configured to maintain a pull-up operation such that an I/O line to retain an I/O voltage or more; a pull-down controller configured to pull down the I/O line in response to a read command, and stop the pull-down operation when a pull-down signal of the I/O line reaches a preset reference voltage; a pulse generation circuit configured to generate a pulse having a constant enable period and constant width when the pull-down signal of the I/O line reaches the reference voltage; and a first transistor configured to float the I/O line by disconnecting the I/O line from the I/O voltage regulator while the pulse with constant width is enabled. When data are transferred to the floated I/O line, the controller may sense and output the data.

In another embodiment, an asynchronous serial communication system may include: a controller configured to control pull-up and pull-down operations for an I/O line, output a pulse signal to the I/O line, the pulse signal swinging between an I/O voltage for controlling the pull-up operation and a first reference voltage for controlling the pull-down operation and corresponding to a transition point of a signal transmitted from outside or a read command, pull down the I/O line in response to the read command, generate a first constant width pulse and stop the pull-down operation when a pull-down signal of the I/O line reaches the first reference voltage, float the I/O line while the first constant width pulse is enabled, and sense and output data when the data are transferred to the floated I/O line; and a semiconductor device configured to perform power charging and write modes using the pulse signal, generate a second constant width pulse in response to the read command when the pull-down signal of the I/O line reaches a second reference voltage, and output read data through the I/O line while the second constant width pulse is enabled.

In another embodiment, an asynchronous serial communication system may include: a controller configured to control pull-up and pull-down operations for an I/O line, output a pulse signal to the I/O line, the pulse signal swinging between a reference voltage for controlling the pull-up operation and an I/O voltage for controlling the pull-down operation and corresponding to a transition point of a signal transmitted from outside or a read command, pull up the I/O line in response to the read command, generate a first constant width pulse and stop the pull-up operation when a pull-up signal of the I/O line reaches the first reference voltage, float the I/O line while the first constant width pulse is enabled, and sense and output data when the data are transferred to the floated I/O line; and a semiconductor device configured to perform power charging and write modes using the pulse signal, generate a second constant width pulse in response to the read command when the pull-up signal of the I/O line reaches the second reference voltage, and output read data through the I/O line while the second constant width pulse is enabled.

In another embodiment, a controller may include: a first mode switch turned on in response to a first switching mode; and a second mode switch turned on in response to a second switching mode. The controller may control pull-up and pull-down operations for an I/O line in response to the turn-on of the first mode switch, output a first pulse signal to the I/O line, the first pulse signal swinging between a first I/O voltage for controlling the pull-up operation and a pull-down reference voltage for controlling the pull-down operation and corresponding to a transition point of a first signal transmitted from outside or a read command, pull down the I/O line in response to the read command, generate a constant width pulse when a pull-down signal of the I/O line reaches the pull-down reference voltage, float the I/O line while the constant width pulse is enabled, and sense and output data when the data are transferred to the floated I/O line. Furthermore, the controller may control the pull-up and pull-down operations for the I/O line in response to the turn-on of second mode switch, output a second pulse signal to the I/O line, the second pulse signal swinging between a pull-up reference voltage for controlling the pull-up operation and a second I/O voltage for controlling the pull-down operation and corresponding to a transition point of a second signal transmitted from outside or a read command, pull up the I/O line in response to the read command, generate the constant pulse when a pull-up signal of the I/O line reaches the pull-up reference voltage, float the I/O line while the constant width pulse is enabled, and sense and output data when the data are transferred to the floated I/O line.

In another embodiment, an oscillator which generates an oscillation signal for recognizing data transmitted through an asynchronous serial communication method may include: a NOR gate configured to transfer an input signal as a delayed signal, the input signal being enabled at the same time as the start of one bit among the first bit and a plurality of data bits following the first bit, which are transmitted through the asynchronous serial communication method; and a plurality of delay circuits connected in series. Each of the delay circuits may include: a delay line and first transfer switch configured to transfer the delayed signal in a forward direction along a forward line; a second transfer switch configured to return the delayed signal in a backward direction along a backward line; and a pass-through switch configured to transfer the delayed signal from the forward line to the backward line; and a latch having a set state decided in response to a signal corresponding to a pulse width of the first bit and the delayed signal, and control the first and second transfer switches and the pass-through switch using outputs corresponding to the set state. The delayed signal may be transferred in the forward direction through the delay lines and the first transfer switches of the one or more delay circuits after the start time point of the first bit, and transferred to the backward line through the pass-through switch of the specific delay circuit at the end time point of the first bit. The delayed signal transferred to the backward line may be returned to the NOR gate through the second transfer switches of the delay circuits, and an oscillation signal may be generated when the NOR gate inverts the signal which is returned through the backward line.

Advantageous Effects

According to the embodiments of the present invention, the semiconductor device may have two terminals of which one terminal is shared for data communication and power source. Therefore, the semiconductor device can perform asynchronous serial communication. In other words, the semiconductor device can write and read data using the shared terminal.

The semiconductor device may have a rectification function for acquiring a supply voltage from data.

Moreover, since the semiconductor device with two terminals can generate the reference clock for asynchronous serial communication, the semiconductor device can write data using the reference clock.

Furthermore, since the energy loss and the sizes of the internal circuits can be minimized, data information generated by the semiconductor device can be stably transferred to the external controller.

The controller can transfer data using a short period pulse, and the semiconductor device can recover the transferred data using the short period pulse, which makes it possible to raise the efficiency of the rectification function using data while realizing the asynchronous serial communication technology capable of removing an error of the data transfer process.

Depending on code information contained in data, the asynchronous serial communication system can determine the read mode and the write mode.

The asynchronous serial communication system can generate timing for determining a high or low state of data inputted through the asynchronous serial communication method in the write mode, using the baud rate of the input data.

Therefore, when the data contains a code indicating the read mode, the semiconductor device with two terminals may generate a clock signal corresponding to the baud rate, receive data from the internal data formation unit using the clock signal, and return to the write mode after receiving the data. The internal data formation unit may indicate the element array including one or more of the sensor element and memory element which are implemented with the CMOS circuit.

Furthermore, the asynchronous serial communication system can generate an output of the semiconductor device in synchronization with the reference pulse signal transferred from the external controller in the read mode, and the external controller can sense and determine the output of the semiconductor device.

When the semiconductor device outputs data, the asynchronous serial communication system can alternately perform the operation of transmitting data from the data providing unit to the output buffer and the operation of transmitting data from the output buffer to the outside. Therefore, the size of the output buffer required for the semiconductor device can be reduced.

Furthermore, since one terminal which is selected between two terminals of the semiconductor device depending on the mode is shared for data communication and power source, the semiconductor device can be utilized flexibly in various purposes.

MODE FOR INVENTION

Figure 1:
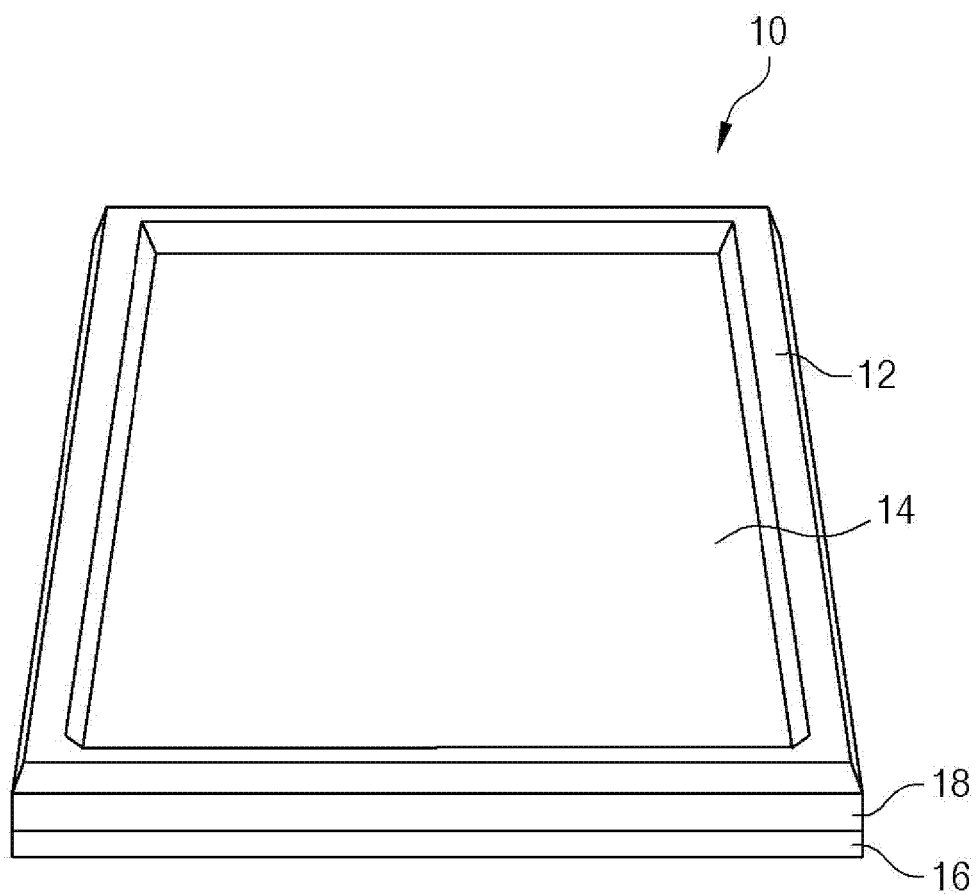
FIG. 1 is a perspective view illustrating a semiconductor device according to an embodiment of the present invention.

Hereafter, embodiments of the present invention will be described in detail with reference to the accompanying drawings. The terms used in the present specification and claims are not limited to typical dictionary definitions, but must be interpreted as meanings and concepts which coincide with the technical idea of the present invention.

Embodiments described in the present specification and configurations illustrated in the drawings are preferred embodiments of the present invention, and do not represent the entire technical idea of the present invention. Thus, various equivalents and modifications capable of replacing the embodiments and configurations may be provided at the point of time that the present application is filed.

The present invention discloses a semiconductor device with two terminals. The semiconductor device according to the embodiment of the present invention may indicate all types of chips fabricated by a semiconductor technology which can be implemented at a low cost, such as a security chip, a medical sensor for single use, an environmental sensor and a small precise sensor for industry.

Referring to FIG. 1, the semiconductor device 10 includes a first terminal 12 and sensing surface 14 formed on a front side thereof and a second terminal 16 formed on a back side thereof. The first terminal 12 is used for a first supply voltage VF, and the second terminal 16 is used for a second supply voltage VB. The first terminal 12 for the first supply voltage VF may include various patterns such as a metal pattern and metal pad, and the second terminal 16 for the second supply voltage VB may include a plate made of metal, for example.

The semiconductor device 10 may include a substrate 18 between the front side on which the first terminal 12 and the sensing surface 14 are formed and the back side on which the second terminal 16 is formed, and the substrate 18 may be formed by p-type semiconductor. The substrate 18 has the sensing surface 14 and various circuits for processing the data generated by reading operation or writing operation on the sensing surface 14, the sensing surface 14 and the various circuits being formed on the semiconductor substrate.

In the present embodiment, the semiconductor device 10 has a structure in which the first and second terminals 12 and 16 are formed on different sides of the substrate 18. However, the present embodiment is not limited thereto, but the first and second terminals 12 and 16 may be formed on the same side of the substrate 18, and the sensing surface 14 may be solely formed on one surface of the substrate 18.

Figure 2:
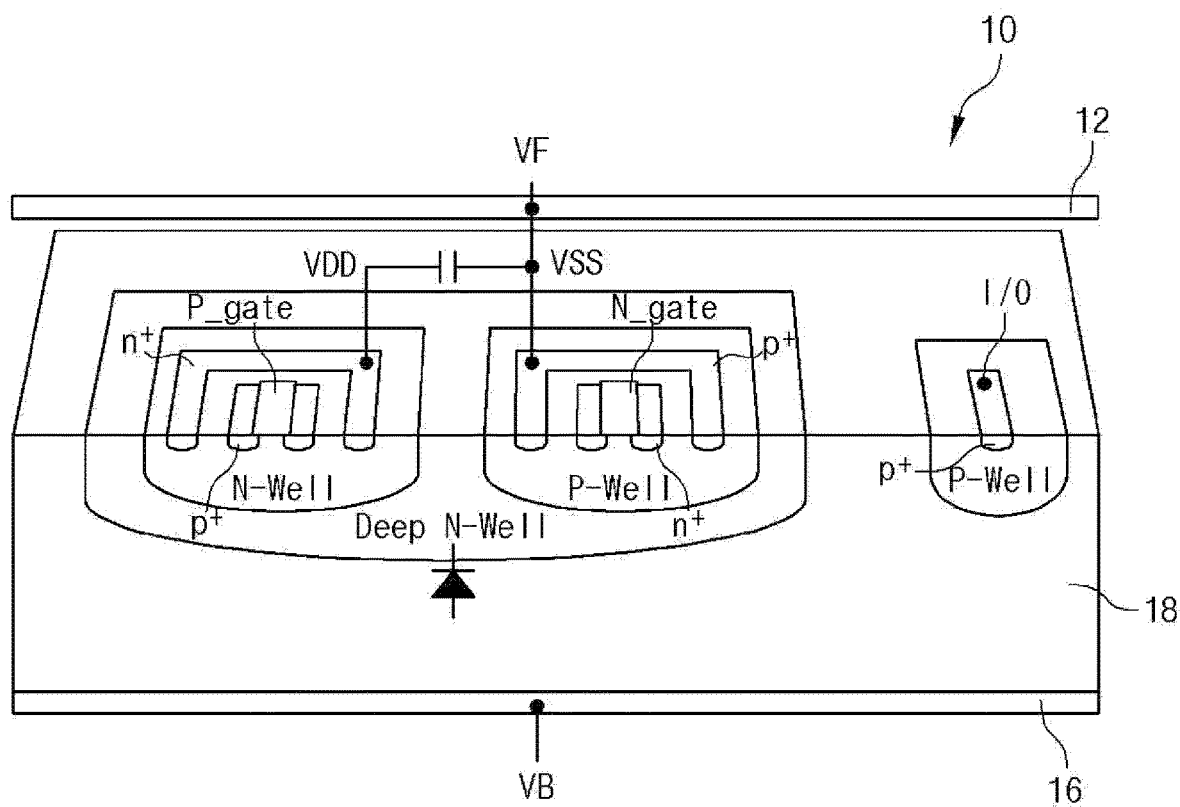
FIG. 2 is a schematic view illustrating cross-sectional and plan structures of the semiconductor device of FIG. 1.

When the first and second terminals 12 and 16 are formed on different sides of the substrate 18, all CMOS components within the semiconductor device have a structure illustrated in FIG. 2.

The substrate 18 has a deep N-well formed therein, and an N-well and P-well are formed in the deep N-well. Each of the N-well and P-well includes a p+ junction and n+ junction for forming a source and drain and a pattern P_gate or N_gate for forming a gate. All CMOS components within an actual semiconductor device are formed using the N-well and P-well formed in the deep N-well, and FIG. 2 illustrates one CMOS component for convenience of description.

A P-well may be formed in a region isolated from the deep N-well of the substrate 18, and have a p+ junction connected to an input/output (I/O) circuit. The P-well serves to widen a contact surface with the P-substrate. Therefore, although only the p+ junction is formed without the P-well, the p+ junction can be connected to the I/O circuit.

When the first and second terminals 12 and 16 are formed on different sides of the substrate 18, the CMOS component may be formed by the above-described deep N-well structure, and have a terminal for receiving a ground voltage VSS and a terminal for receiving a data I/O voltage VIO.

FIG. 2 illustrates that metal layers are formed on both sides of the substrate 18, in order to form the first terminal 12 for receiving the first supply voltage VF and the second terminal 16 for receiving the second supply voltage VB. Furthermore, a PN diode is formed between the P-substrate and the deep N-well. The data I/O voltage applied to the substrate 18 is represented by VIO, and an operating voltage applied to the CMOS component is represented by VDD.

In the CMOS component of FIG. 2, when the data I/O voltage VIO is positive, a signal of the second terminal 16 on the back side may be transferred to an operating voltage node VDD corresponding to an internal supply voltage of the CMOS component through the PN junction formed by the substrate 18 and the deep N-well. On the other hand, when the data I/O voltage VIO is negative, the PN junction may be blocked.

Between the operating voltage node VDD corresponding to the internal supply voltage and a ground voltage node VSS corresponding to the first terminal, a capacitor is present. The capacitor may be used to perform a rectification function.

In FIG. 2, the CMOS component has a contact, as the second terminal, used for both data I/O and generating an internal supply voltage VDD, and the other contact, as the first terminal, for applying the ground voltage VSS.

In the CMOS component according to one embodiment of the present invention, a contact for applying the ground voltage VSS forms the first terminal, and the other contact and another contact are commonly connected to form the second terminal. The other contact is for data I/O and the another contact is for the internal supply voltage VDD through a rectification circuit having a PN diode and capacitor.

The CMOS component has a two-terminal structure for the supply voltages VB and VF, like a resistor or diode which is a two-terminal element. Therefore, an operation of providing a pull-down signal to the VB terminal connected to the contact for data I/O and an operation of providing a pull-up signal to the VF terminal for receiving the ground voltage may be considered as the same operation from the viewpoint of the CMOS component. Therefore, the CMOS component according to the embodiment of the present invention may have two kinds of methods for applying an external signal to cause the same operation.

The semiconductor device according to the embodiment of the present invention, which includes the CMOS component having the above-described configuration, may have two terminals of which one terminal is shared for data communication and power source.

Furthermore, the semiconductor device may have a rectification function for acquiring a supply voltage from data input.

Figure 3:
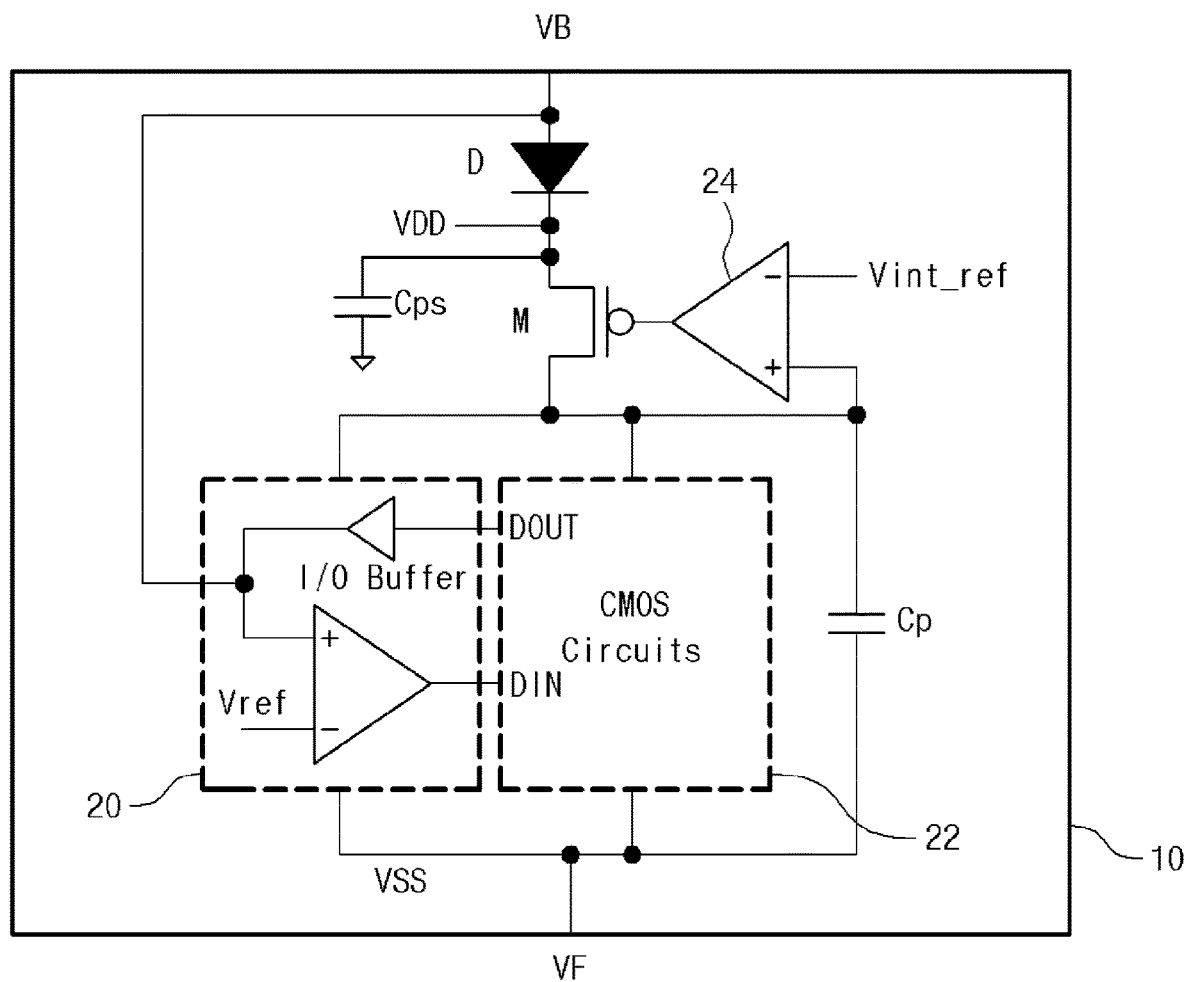
FIG. 3 is a block diagram illustrating the semiconductor device according to the embodiment of the present invention.

The semiconductor device having the structures of FIGS. 1 and 2 may be schematically expressed as illustrated in FIG. 3, and the semiconductor device 10 can secure power from data and perform data communication through the configuration of FIG. 3.

FIG. 3 illustrates that a voltage regulator using a PMOS transistor M is added to the structure of FIG. 2, in order to improve variability of the operating voltage VDD. However, a system which does not require an accurate supply voltage can be operated even though the operating voltage VDD is directly used without a voltage regulator.

The semiconductor device 10 of FIG. 3 includes an I/O circuit 20, a CMOS circuit 22 implemented by arrays of CMOS components, capacitors Cp and Cps, a comparator 24 for controlling the charging operation of the power source, the PMOS transistor M for regulating the charging operation, and a rectification diode D. When the first and second terminals 12 and 16 are formed on different sides of the substrate 18, the diode D is formed by the deep N-well.

FIG. 3 illustrates that data are transferred through the second supply voltage VB. The second supply voltage VD indicates a voltage which is applied to the second terminal 16 shared by the data I/O terminal, between the first and second terminals 12 and 16. In the configuration of FIG. 3, when data are inputted through the second terminal to which the second supply voltage VB is applied, the semiconductor device 10 can perform charging and data write.

The diode D and the capacitor Cps constitute a rectification circuit. Furthermore, the PMOS transistor M, the comparator 24 and the capacitor Cp constitute a regulator, and the rectification circuit and the regulator controls charging using data input.

The data are rectified by the diode D and the capacitor Cps and then transferred to the capacitor Cp through the PMOS transistor M, and the capacitor Cp is charged by the potential of the rectified data. The regulator controls the PMOS transistor M to transfer the data for charging to the capacitor Cp through an operation of the comparator 24 to compare the charging level of the capacitor Cp to a preset reference voltage Vint_ref.

In addition to the above-described configuration, an output of the rectification circuit constituted by the diode D and the capacitor Cps may be directly used without the regulator, when an accurate regulator output is not necessary.

As described above, the capacitors Cp and Cps may be used for power source, and charged with an output of the diode D.

Furthermore, the data transferred through the second supply voltage VB may be inputted to the I/O circuit 20 in a write mode. When the semiconductor device 10 is in a read mode, however, data provided from the I/O circuit 20 may be outputted through the second terminal for applying the second supply voltage VB.

The I/O circuit 20 includes an I/O buffer for data I/O, and the I/O buffer will be described in detail later.

The CMOS circuit 22 performs an operation of writing input data or reading output data, and is interfaced with the I/O circuit 20 in order to write or read data.

The CMOS circuit 22 can secure an electrical characteristic of a sensing target through the sensing surface 14. The CMOS circuit 22 may be expressed as an element array including at least one of sensor elements or memory elements which are implemented with CMOS components.

The sensor element and the memory element indicate the minimum sensor unit and the minimum memory unit, respectively, which use the CMOS component. When sensor elements constitute an array, the array may be referred to as a sensor array, and when memory elements constitute an array, the array may be referred to as a memory array. The element array may be expressed as any one of the sensor array and the memory array.

Figure 4:
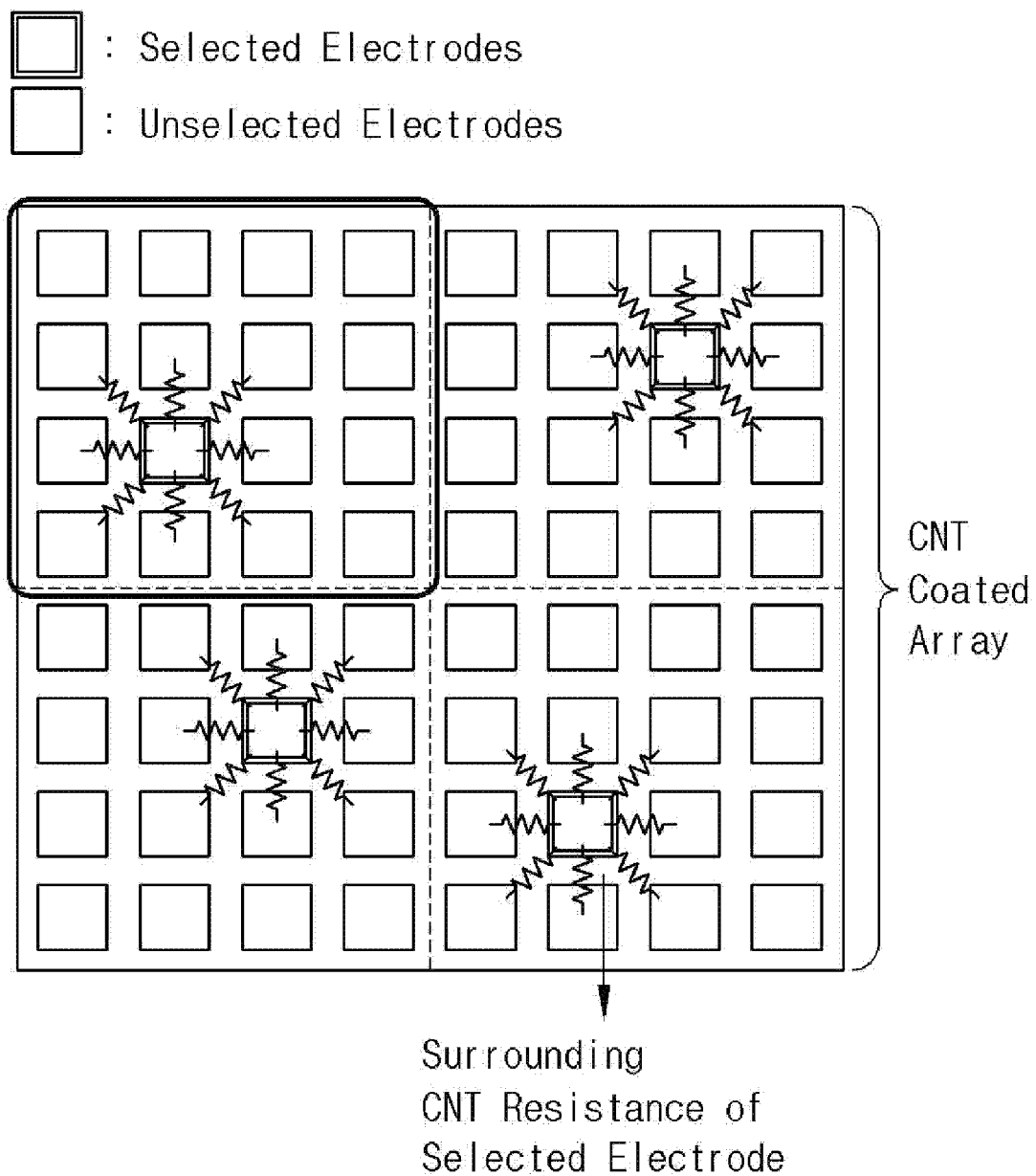
FIG. 4 is a diagram for describing an action of CNT resistance in the semiconductor device according to the embodiment of the present invention.

FIG. 4 illustrates the structure of an element array including sensor elements. In order to measure an electrical characteristic of a sensing target, the sensing surface 14 may be coated with a carbon nano-tube (CNT). This structure will be described with reference to FIG. 4.

FIG. 4 illustrates that each unit array of the sensing surface 14 includes 16 electrodes, and a CMOS component is installed for each of the electrodes. At this time, when an electrode corresponding to a specific CMOS component is selected by data, electrodes corresponding to the other CMOS component are automatically connected to the ground voltage in order to provide surrounding CNT resistance. Through the engagement of the CNT resistance as illustrated in FIG. 4, the semiconductor device according to the present embodiment can sense the electrical characteristic of the sensing target.

The serial communication method sequentially transmits a plurality of data through one line. The asynchronous serial communication method which does not use external clock signals separates data into n binary data bits, and transmits one data bit at a time through a communication line. Therefore, the receiver side should recover the data by combining the bits received through the communication line. At this time, a start bit and stop bit may be used in order to identify the range of one data.

The transmitter side transmits data bits after transmitting the start bit. The data may include seven or eight data bits in one data range.

When the semiconductor device is configured to have two pins as in the present embodiment, the baud rates of the transmitter side and the receiver side need to be matched with each other. The baud rate indicates the transmission speed of the data bits. A typical universal asynchronous receiver & transmitter (UART) technology is an asynchronous serial communication technology in which high and low voltages are set in the range of 0 to 5V.

In the present embodiment, the semiconductor device is configured to have two terminals, and one terminal of the two terminals is shared for data communication and power source. The shared terminal of the semiconductor device is used to secure power while being used for data I/O.

That is, data inputted through the shared terminal of the semiconductor device may be used as a supply voltage through rectification and charging by a capacitor, when the data are passed through a PN junction diode or MOS diode. However, only a high period of the input data is used for charging. Therefore, the high period of the input data needs to be set to a larger size than the low period of the input data, in order to increase the efficiency of the rectification circuit.

Therefore, the asynchronous serial communication system according to the present embodiment uses a pulse transmission method which generates a pulse with a short low period at a data transition time that input data transitions from low to high or from high to low while the data I/O signal VIO is retained at a high level in a most of time. When the pulsed data I/O signal VIO are loaded and transmitted to a semiconductor device, the semiconductor device recovers the pulse signal into the actual data input signal through a toggle flip-flop.

According to the pulse transmission method, although the potential of the data is varied according to a change of the data value, the supply voltage can be stably retained by the rectification function.

The asynchronous serial communication system according to the present embodiment uses semiconductor devices each having only two terminals, and performs a communication method that provides commands to the plurality of semiconductor devices using one controller (write operation) and sequentially receives data outputted from the semiconductor devices through one communication line (read operation).

The semiconductor device with two terminals VF and VB according to the present embodiment may have a configuration in which the ground voltage VSS is fixed to the VF terminal and pulse data having a short low period is applied to the VB terminal, or have a configuration in which the operating voltage VDD is fixed to the VB terminal and pulse data having a short high period with the opposite polarity is applied to the VF terminal, in order to perform the same operation.

Therefore, the system according to the present embodiment employs the asynchronous serial communication technique for performing communication through one communication line and the pulse transmission technique for converting data into power by efficiently rectifying the data. Furthermore, the system according to the present embodiment employs a technique for checking and using a baud rate such that a semiconductor device corresponding to the receiver side can distinguish data which are changed on a time basis.

Figure 5:
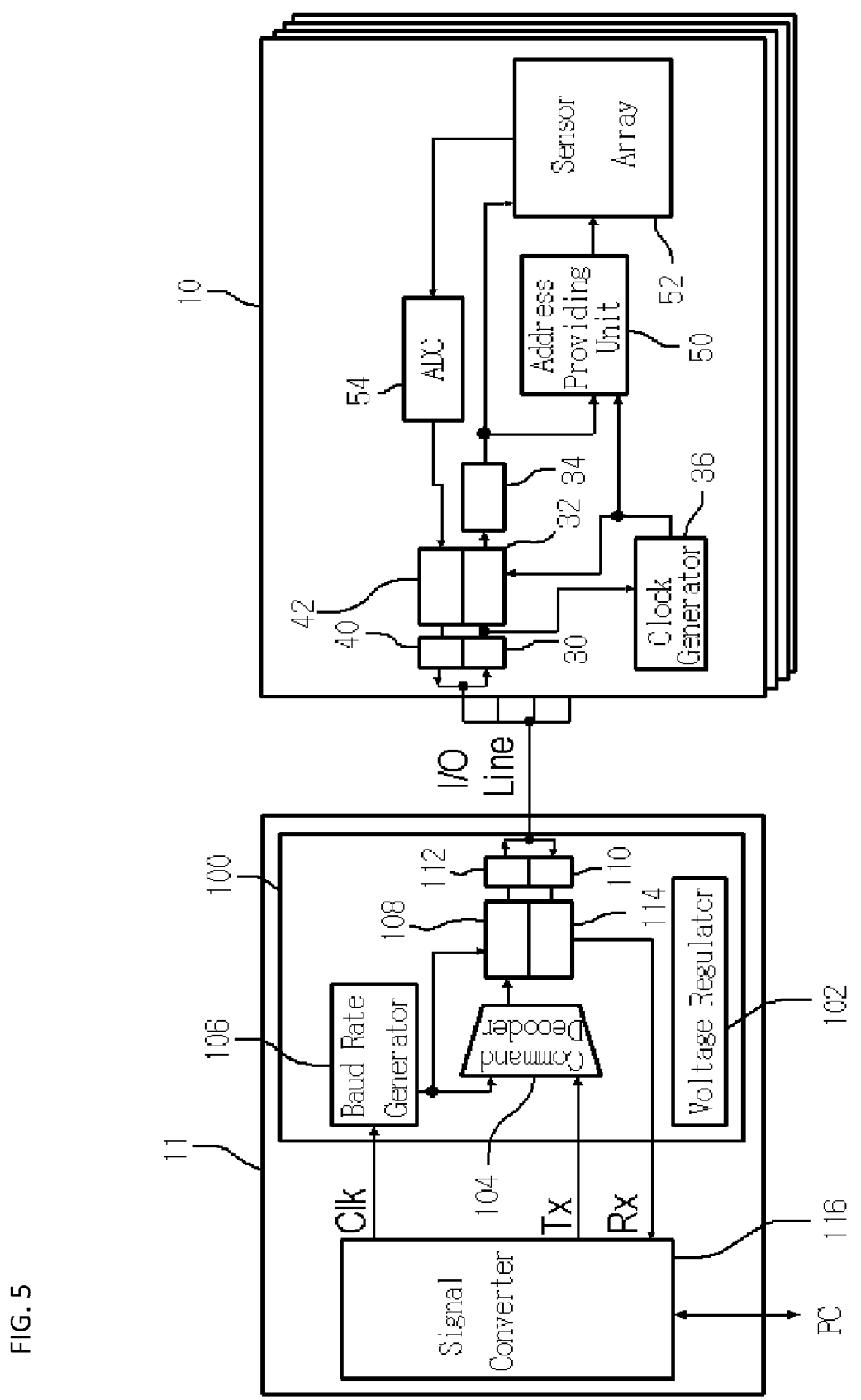
FIG. 5 is a block diagram illustrating an asynchronous serial communication system according to an embodiment of the present invention.

The asynchronous serial communication system according to the embodiment of the present invention, which employs the above-described techniques, is illustrated in FIG. 5.

FIG. 5 illustrates one controller 100 and a plurality of semiconductor devices 10. The controller 100 may be mounted as a chip on a control module 11, the control module 11 may include the controller 100 and a signal converter 116, and the signal converter 116 may perform signal conversion for an interface with an external device such as a personal computer (PC).

FIG. 5 does not specifically illustrate two terminals of the semiconductor device 10. However, one terminal may be defined as a terminal connected to an I/O line used as a communication line, and the other terminal may be defined as a terminal connected to a power line which applies a voltage for defining the voltage of the I/O line.

The semiconductor device 10 includes an input buffer 30, a pulse signal recovery circuit 32 and a command decoder 34, in order to receive data. The semiconductor device 10 includes a FIFO (First In First Out) memory 42 for storing data to output according to a predefined protocol and an output buffer 40.

The semiconductor device 10 may further include a clock generator 36 for internally generating a fixed frequency clock to match a baud rate with that of the external controller 100 and a circuit for deciding the capture timing of serial data by arbitrarily measuring the edge of the start bit.

When the sensor array 52 is constituted by CMOS components with two terminals, the semiconductor device 10 needs to set a mode for determining a write or read operation. The sensor array 52 of FIG. 5 corresponds to the CMOS circuit 22 of FIG. 3, and is an element array including sensor elements. For reference, FIG. 5 illustrates the components for receiving and outputting data, but does not illustrate the components for power charging, which are illustrated in FIG. 3.

The semiconductor device 10 is initialized to the default state in which the semiconductor device 10 is set in the write mode.

During the write mode for programming an internal operation, the semiconductor device 10 recognizes a pulse signal through the input buffer 30, recovers the recognized pulse signal into an actual signal through the pulse signal recovery circuit 32, and recognizes the recovered signal as data using the command decoder 34.

The semiconductor device 10 recognizes the write command through the command decoder 34. In response to the write command, an address providing unit 50 provides a write address, and data corresponding to the write address are provided to the sensor array 52.

Therefore, the data recognized by the command decoder 34 are written to the sensor array 52 at the address provided by the address providing unit 50.

The pulse signal recovery circuit 32 recovers a signal according to the clock signal provided by the clock generator 36. As described later with reference to FIGS. 9 and 10, the clock generator 36 may detect the start bit, and provide the fixed frequency clock signal.

The semiconductor device 10 starts a read operation in response to a read mode code which is one of command codes.

When the read mode code and the clock signal are inputted from the controller 100, the semiconductor device 10 outputs data of the designated address of the sensor array 52.

At this time, the command decoder 34 recognizes the read mode code recovered by the pulse signal recovery circuit 32 and provides a read command, and the address providing unit 50 provides a read address in response to the read mode.

In order to sequentially synchronize a plurality of data corresponding to the address provided by the address providing unit 50, the clock signal of the clock generator 36 is used. After outputting all of a predefined length of data, the semiconductor device 10 automatically returns to the write mode, and waits for an input of the next command.

When one I/O line is shared by the plurality of semiconductor devices 10, a unique code allocated to each of the semiconductor devices 10 may be contained in the read mode code. In this case, only the semiconductor device 10 corresponding to the unique code for identifying the semiconductor device 10 may perform a read operation.

When the read operation is started, an analog signal outputted from the sensor array 52 in the semiconductor device 10 is converted into a digital signal through an analog digital converter (ADC) 54, and the digital signal is transferred to the I/O line through the output buffer 40 via the FIFO memory 42.

The controller 100 receives the data transferred through the I/O line according to a predefined protocol.

The semiconductor device 10 uses the FIFO memory 42 to output data at a size defined by the predefined protocol. The FIFO memory 42 repeats an operation of sequentially storing and outputting data at the defined size, until all the data are outputted.

The controller 100 generates a signal to transmit through one I/O line according to a protocol through which the semiconductor device 10 with two pins can receive the signal, and receives the signal transmitted through the one I/O line according to the predefined protocol by the semiconductor device 10 with two terminals. The controller 100 is interfaced with the signal converter 116 in order to receive a transmit signal Tx and a clock signal CLK and transmit a receive signal Rx.

For this operation, the controller 100 may include a voltage regulator 102, a command decoder 104 and a baud rate generator 106. The voltage regulator 102 generates a stable voltage required for an operation of the semiconductor device 10 with two terminals, the command decoder 104 receives a transmit signal Tx and provides a command (data), and the baud rate generator 106 generates a capture timing of data provided to interface with the semiconductor device 10 with two terminals.

The controller 100 may further include a pulse signal generator 108 for providing a pulse signal to one I/O line, an output buffer 112 for outputting the signal, and an input buffer 110 for receiving a signal inputted from the I/O line without an error.

The signal inputted to the controller 100 from the semiconductor device 10 has a relatively low level.

Therefore, the controller 100 requires a sensor with an amplifier to receive a low-level signal, and a logic circuit for adding a start bit or stop bit according to a transmission protocol (for example, UART), before transmitting a signal sensed by the sensor to an external device such as a personal computer (PC).

The controller 100 may include a converter 114 in order to transmit data to an external device such as a PC, and the converter 114 may include the sensor with the amplifier and the logic circuit for changing a sensed signal according to the transmission protocol.

As described above, the controller 100 according to the embodiment of FIG. 5 includes: the voltage regulator 102 configured to generate a stable voltage required for an operation of the semiconductor device 10 with two terminals; the command decoder 104 configured to provide data corresponding to a signal transmitted from outside; the baud rate generator 106 configured to generate a capture timing of data provided to interface with the semiconductor device 10 with two terminals; the pulse signal generator 108 configured to provide a pulse signal for loading the data of the command decoder 104 to one I/O line according to the capture timing; the output buffer 112 configured to output the signal of the pulse signal generator 108 to the semiconductor device 10 through one I/O line using the voltage of the voltage regulator 102; the input buffer 110 configured to receive a signal from the semiconductor device 10 through one I/O line; and the converter 114 configured to convert the signal of the input buffer 110 in order to transmit the signal to an external device.

The baud rate generator 106 and the converter 114 which are included in the controller 100 may be installed as additional components outside the controller 100.

Hereafter, an asynchronous serial communication method using two terminals, which is performed in the system according to the present embodiment, will be described with reference to the accompanying drawings.

Figure 6:
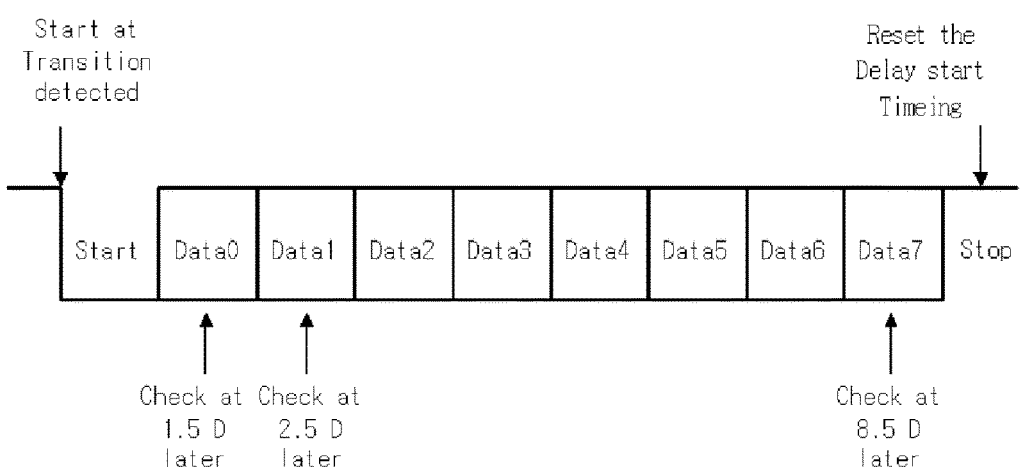
FIG. 6 is a waveform diagram for describing a data receiving method using a fixed delay.

FIG. 6 illustrates a data stream for describing a method for sequentially receiving data based on UART communication.

Data may be composed of seven or eight bits. However, FIG. 6 illustrates that a start bit and stop bit are added to the head and tail of the data, respectively, for asynchronous serial communication.

The data retains a high level in a standby state.

When a delay circuit having a fixed delay value is used, the data may be sequentially recognized at timings with delay values of 1.5, 2.5, etc, for example, after the start timing of the start bit which transitions from a high level to a low level.

The delay circuits may be applied to match the timings at which data are recognized, and the delay value D of 1 may correspond to one cycle of the start bit. Therefore, the timing at which data are recognized when the delay value is 1.5 corresponds to a timing at which time has elapsed by one and half cycle of the start bit from the start timing of the start bit, and the timing at which data are recognized when the delay value is 2.5 corresponds to a timing at which time has elapsed by two and half cycles of the start bit from the start timing of the start bit.

However, when the delay circuit is used to recognize data, a transmitter chip should know the fixed delay value of a receiver chip, and a baud rate corresponding to the delay value should be set in the transmitter chip. Furthermore, the delay value of the delay circuit may be varied depending on a condition such as a temperature or a process condition of fabricating a chip. Thus, when the delay circuit is used to recognize data transmitted through the asynchronous serial communication method, a problem may occur.

In order to overcome the problem, the semiconductor device 10 according to the present embodiment may include a circuit for measuring a low period in which the start bit of a signal transmitted from the controller 100 is enabled, generate a variable baud delay using the circuit, and sequentially recognize data using the baud delay.

Figure 7:
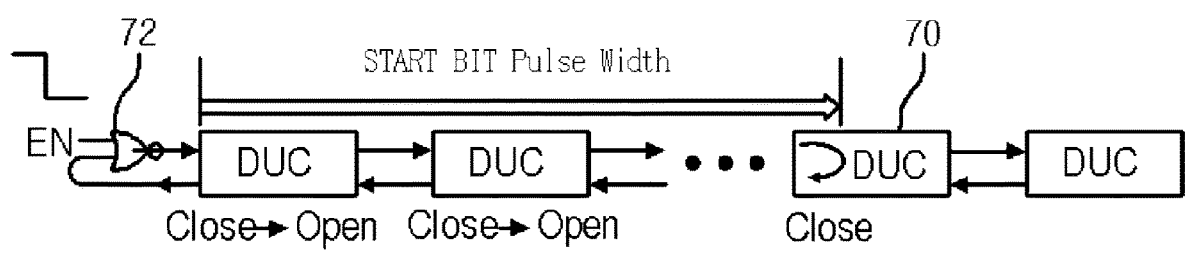
FIG. 7 is a block diagram illustrating an oscillator for applying a variable delay.
Figure 8:
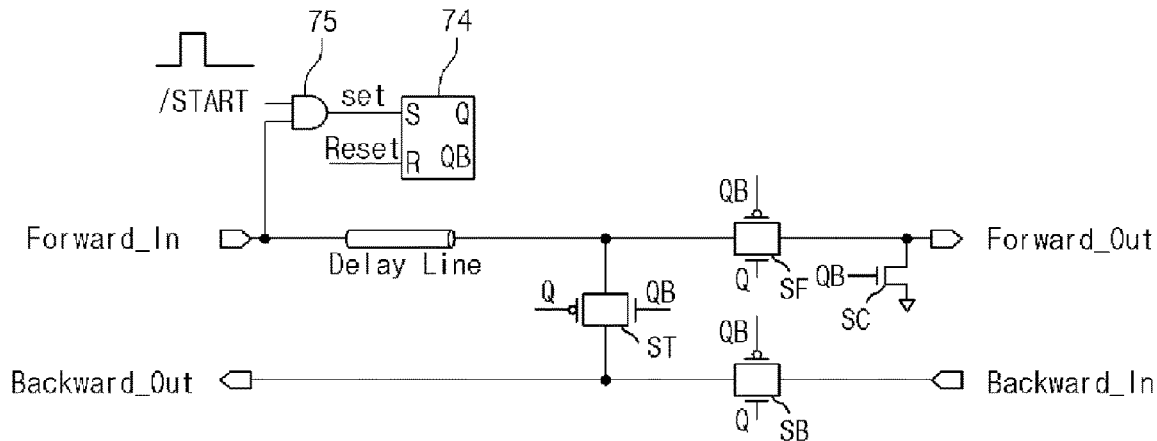
FIG. 8 is a detailed circuit diagram illustrating a delay circuit of FIG. 7.

The semiconductor device 10 according to the present embodiment may recognize data using a ring oscillator as illustrated in FIG. 7. The ring oscillator of FIG. 7 can measure a point of time at which the start bit transitions to a low level and a point of time at which the start bit returns to a high level. The ring oscillator may be included in the clock generator 36. The ring oscillator includes a plurality of delay unit circuits (DUCs) 70 and a NOR gate 72, and each of the DUCs 70 includes a latch 74 as illustrated in FIG. 8. The plurality of DUCs 70 form a chain connected in series, and the NOR gate 72 receives an enable signal EN transitioning from high to low at the start time point of the start bit and a delay signal returned from the plurality of DUCs 70 connected in series, and provides an output to the first DUC 70. The enable signal EN is retained at a low level after transitioning from a high level to a low level. The delay signal indicates a signal transmitted between the respective DUCs 70, and the delay signals returned to the NOR gate 72 retains a low level at the initial stage, and transitions to a high level at the point of time that the start bit transitions to a high level.

The ring oscillator includes a plurality of DUCs 70 connected in series, and maintains or stops delaying the delay signal transferred between the DUCs 70 according to an output of the latch 74, in order to measure the low period of the start bit. When the transfer of the delay signal between the DUCs 70 is stopped at the end time point of the start bit, the ring oscillator returns the delay signal from the corresponding DUC 70 to the NOR gate 72.

Referring to FIG. 8, the configuration of the DUC 70 will be described.

The DUC 70 includes a forward line for transferring a delay signal in the forward direction and a backward line for transferring a delay signal in the backward direction.

The DUC 70 includes a pass-through switch ST for selectively connecting the forward line and the backward line, a transfer switch SF installed on the forward line to transfer the delay signal in the forward direction, and a transfer switch SB installed on the backward line to transfer the delay signal in the backward direction.

The DUC 70 includes a delay line installed on the forward line so as to delay the delay signal. The DUC 70 may further include a precharge switch SC for precharging the forward line between the transfer switch SF and the DUC 70 at the next stage, and the precharge switch SC may precharge the forward line when the transfer switch SF is turned off.

Each of the pass-through switch ST and the transfer switches SF and SB may include a transfer gate in which an NMOS transistor and a PMOS transistor are coupled in parallel. The pass-through switch ST receives a negative output QB of the latch 74 through the gate of the NMOS transistor, and receives a positive output Q of the latch 74 through the gate of the PMOS transistor. Each of the transfer switches SF and SB receives the positive output Q of the latch 74 through the gate of the NMOS transistor, and receives the negative output QB of the latch 74 through the gate of the PMOS transistor. The precharge switch SC may include an NMOS transistor to receive the negative output QB of the latch 74 through the gate thereof.

The DUC 70 includes the latch 74 for providing a switching signal to decide the switching states of the respective switches SF, SB and SC. The latch 74 may include an SR flip-flop.

The DUC 70 further includes an AND gate 75 configured to receive the delay signal transferred through the forward line and a signal of which the start bit is inversed (hereafter, referred to as a reverse start bit/START), and an output of the AND gate 75 is provided as a set signal SET to the latch 74.

The latch 74 decides the states of the positive output Q and the negative output QB depending on the states of the set signal SET and the reset signal RESET.

The positive output Q and the negative output QB of the latch 74 correspond to switching signals. The latch 74 outputs the positive output Q at a low level and outputs the negative output QB at a high level, when the reset signal RESET is enabled to a high level and the set signal SET is disabled to a low level. On the other hand, the latch 74 outputs the positive output Q at a high level and outputs the negative output QB at a low level, when the reset signal RESET is disabled to a low level and the set signal SET is enabled to a high level.

In the initial state, the DUC 70 is reset, and the reset of the DUC 70 opens the pass-through switch ST, and closes the transfer switches SF and SB.

When the reverse start bit transitions from low to high at the start time point of the start bit, the enable signal EN also transitions from high to low. At this time, the reset signal RESET is disabled.

When the enable signal EN transitions to a low level, the NOR gate 72 outputs a high-level delay signal to the first DUC 70 because inputs thereof are set to a low level.

When the reset of the DUCs 70 is released after the start bit is started, the latches 74 of the respective DUCs 70 are sequentially set in response to the delay signals which are sequentially transferred, and output the positive output Q at a high level. According to the set state of the latch 74, the pass-through switch ST is closed, and the transfer switches SF and SB are opened.

Through the sequential operations of the DUCs 70, the delay signal is transferred in the forward direction during an enable period in which the reverse start bit is retained at a high level, and transferred through the DUCs 70 until the start bit transitions from low to high.

The latch 74 of the DUC 70 corresponding to the point of time at which the start bit transitions from low to high or the reverse start bit transitions from high to low outputs the positive output Q at a low level, because the set signal SET is at a low level.

That is, the pass-through switch ST of the DUC 70 corresponding to the point of time at which the start bit is ended is opened, and the transfer switches SF and SB of the DUC 70 are closed. Therefore, the delay signal is not transferred in the forward direction any more, but transferred to the backward line from the forward line through the pass-through switch ST and returned through the backward line.

The ring oscillator transfers the delay signal in the forward direction through the forward lines of a plurality of DUCs 70 in series from the start time point to the end time point of the start bit, and returns the delay signal to the NOR gate 72 through the backward lines of a plurality of DUCs 70 in series at the end time point of the start bit.

Ideally, it is assumed that no delay time is applied to a path through which a delay signal is returned. When it is assumed that a delay time at a point of time at which the delay line of the DUC 70 transitions from low to high (rising point) is equal to a delay time at a point of time at which the delay line of the DUC 70 transitions from high to low (falling point), the ring oscillator can generate an oscillation signal having a cycle corresponding to two times the pulse width of the start bit.

However, the path through which the delay signal is returned inevitably has a delay time. Therefore, an increase in cycle of the oscillation signal, which is caused by a delay of the pass-through switch ST and a minute delay of the backward line, needs to be compensated for in order to accurately set the cycle of the oscillation signal. For this operation, the delay line may be configured in such a manner that the delay time of the falling point is longer than the delay time of the rising point.

That is, the delay line of the DUC may have a high-to-low delay shorter than a low-to-high delay for the delay signal, in order to compensate for the delay of the pass-through switch ST and the delay through the backward line.

As such, clock duty control needs to be performed in such a manner that the sum of delays of the forward line and the backward line corresponds to a delay deciding the cycle of one oscillation signal.

The delay line may be designed to include two or more stages of driving circuits each having a CMOS component in which a PMOS transistor and NMOS transistor are combined. If necessary, a capacitor may be additionally installed at an output terminal of the driving circuit at each stage.

The cycle of the oscillation signal is decided by the number of driving circuit stages and resistance values present in the respective stages. Therefore, the cycle of the oscillation signal may be adjusted by varying the resistance values. On the other hand, when a resistor using an NMOS transistor or PMOS transistor is used, the cycle of the oscillation signal may be decided by adjusting a gate bias voltage applied to each stage. Therefore, the clock duty control may also be performed by adjusting the resistance values.

Figure 9:
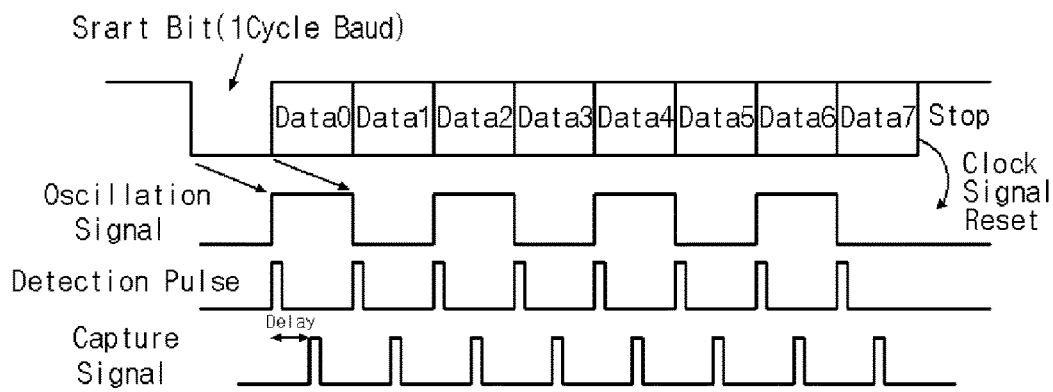
FIG. 9 is a timing chart for describing a method for generating timing for data recognition by measuring the pulse width of a start bit.
Figure 10:
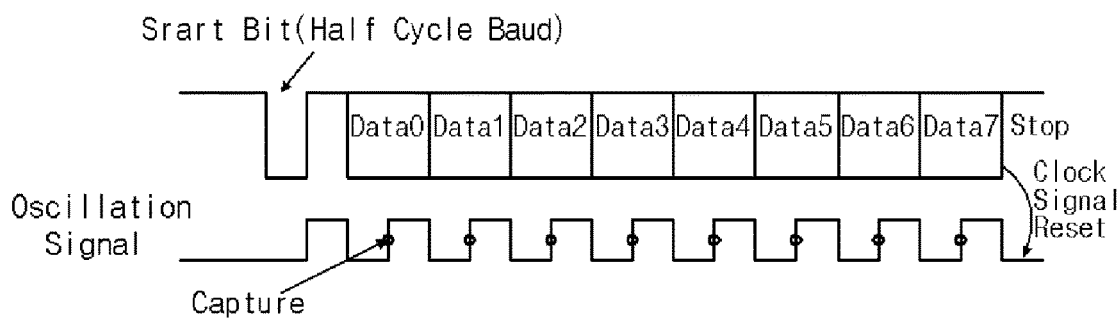
FIG. 10 is a timing chart for describing a method for generating timing for data recognition by varying the pulse width of a low period of a start bit.

FIGS. 9 and 10 are waveform diagrams for describing a method which measures the pulse width of a start bit and generates a capture signal for data recognition without an external clock signal. The pulse width of the start bit may be measured by the clock generator 36, and the capture signal and a detection signal described later may be generated by the pulse signal recovery circuit 32.

The cycle of an oscillation signal generated through the start bit of FIG. 9 is two times larger than the baud size of the start bit, as described with reference to FIGS. 7 and 8. Therefore, a detection circuit is needed in order to generate timing for data recognition. The detection circuit detects transition points at which the oscillation signal transitions from high to low or from low to high, and generates detection pulses synchronized with the detected transition points. Furthermore, a delay circuit is needed to delay the detection pulses such that the detection pulses are positioned in the middle of periods in which data are transmitted. The detection circuit and the delay circuit may be installed in the pulse signal recovery circuit 32.

When the controller 100 is configured to generate the capture signal through the signal processing process illustrated in FIG. 9, the controller 100 can directly use a signal protocol transferred from outside. Thus, the controller 100 does not need to correct the signal.

However, when the capture signal is generated through the signal processing process illustrated in FIG. 9, the controller 100 may effectively use only seven bits of the 8-bit data because first data DATA0 following the start bit should be retained at a high level, and needs to include a delay circuit for delaying a detection signal to have a timing for data recognition. In order to compensate for delay time of the backward line and the delay of the pass-through switch ST within the DUC 70 installed in the ring oscillator, the controller 100 needs to control the clock duty. Therefore, a difference may occur between even and odd timings.

In the present embodiment, the controller 100 may be configured to reduce the start bit in half and transfer the reduced start bit to the semiconductor device 10, as illustrated in FIG. 10. For the embodiment of FIG. 10, the controller 100 needs a circuit for reducing the start bit of a signal received from outside in half.

In this case, the cycle of the oscillation signal generated by the ring oscillator becomes equal to the baud size of the start bit. When the oscillation signal is generated as illustrated in FIG. 10, a timing for data recognition can be secured without a delay circuit, and a timing difference caused by the clock duty does not occur.

When the oscillation signal is generated as illustrated in FIG. 10, the controller 100 does not need to include a delay circuit for delaying a detection signal to have a timing for transition detection or data recognition, unlike the configuration of FIG. 9.

However, in order to generate the oscillation signal as illustrated in FIG. 10, the controller 100 requires a separate signal processing process for adjusting the start bit. In addition, when a small number of delay stages are applied during a process of measuring a start bit with a short period, a rounding off error may occur in the ring oscillator.

In order to decide a timing at which data are captured, the controller 100 for performing the signal processing process of FIG. 9 or 10 can be selected according to a designer's convenience.

The embodiment of the present invention discloses a method for enabling an operation of the semiconductor device 10 with two terminals, while one of the two terminals is efficiently shared for data and power.

Figure 11:
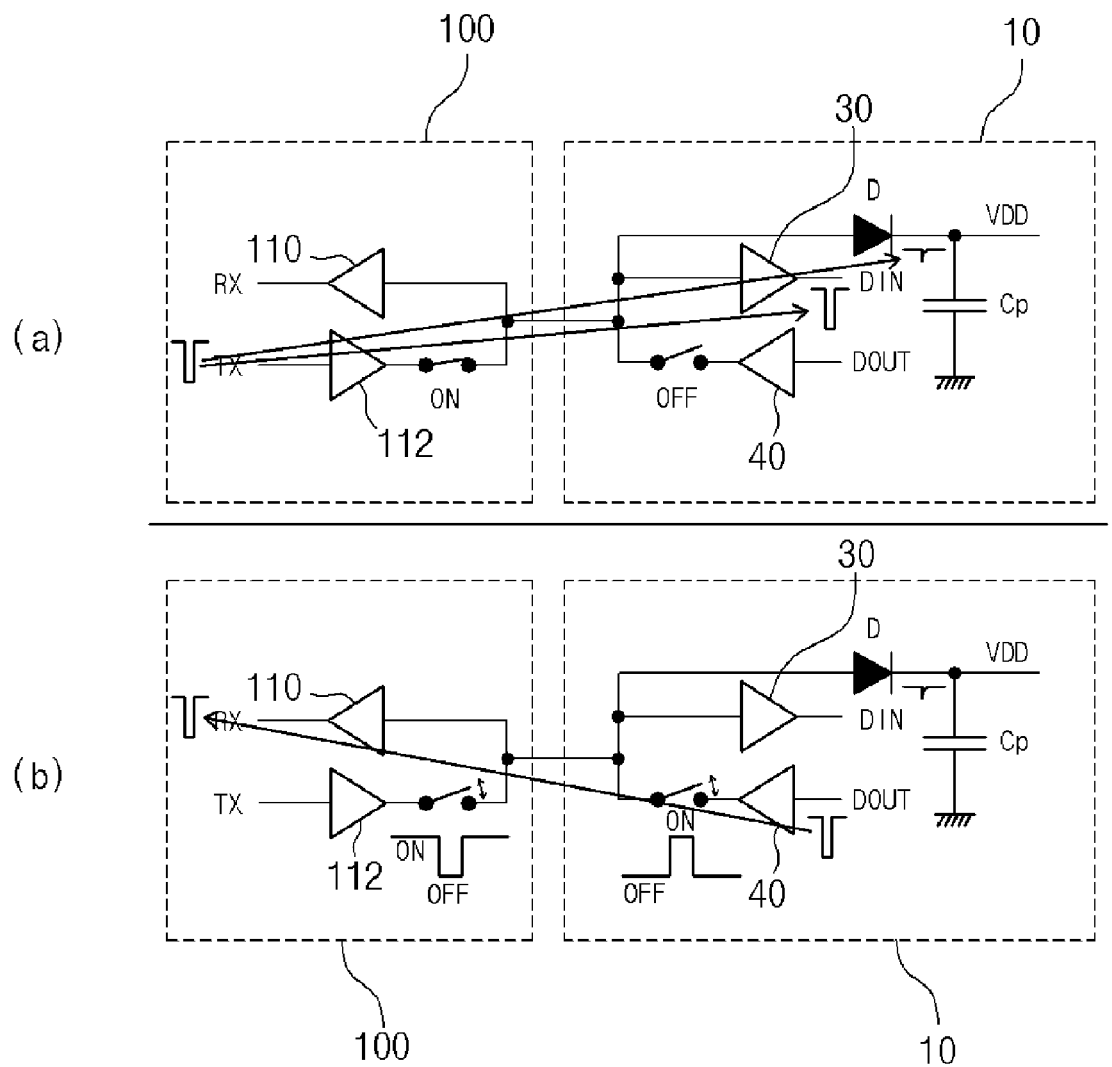
FIGS. 11A and 11B are diagrams for describing write and read operations between a controller and semiconductor device.

The semiconductor device 10 with two terminals may use a rectification circuit having a diode and capacitor as illustrated in FIGS. 11A and 11B, such that one terminal is shared for data communication and power source.

FIGS. 11A and 11B illustrate that the controller 100 and the semiconductor device 10 transmit data through tri-state I/O. Specifically, FIG. 11A is a circuit diagram illustrating that the controller 100 writes data to the semiconductor device 10, and FIG. 11B is a circuit diagram illustrating that the controller 100 reads data from the semiconductor device 10.

When the controller 100 writes data to the semiconductor device 10 as illustrated in FIG. 11A, an output buffer 112 of the controller 100 is always in the ON state, and an output buffer 40 of the semiconductor device 10 is always in the OFF state.

The signal outputted from the controller 100 is transferred to an input buffer 30 of the semiconductor device 10. Simultaneously, a high-level signal is provided as power for the operating voltage VDD through a diode D. The operating voltage VDD may be provided as the capacitor Cp is charged with a high-level voltage of the signal outputted from the controller 100.

On the other hand, when the controller 100 reads data from the semiconductor device 10 as illustrated in FIG. 11B, tri-state input/output control synchronized between the controller 100 and the semiconductor device 10 is required. That is, while the output buffer 40 of the semiconductor device 10 is retained in the ON state, the output buffer 112 of the controller 100 should be turned off. For the input/output control between the controller 100 and the semiconductor device 10, the controller 100 may send a reference signal for synchronization, and the I/O timings of the controller 100 and the semiconductor device 10 may be synchronized with each other according to the reference signal.

However, when the controller 100 writes data to the semiconductor device 10, the amount of charge stored in the capacitor Cp of the semiconductor device 10 may be not enough to retain the operating voltage VDD, in the case where the data are retained at a low level or the low period is lengthened by a low-frequency operation.

Furthermore, when the controller 100 reads data from the semiconductor device 10, the signal outputted from the semiconductor device 10 is based on the amount of charge stored in the capacitor Cp. Therefore, when the operation period is increased or the I/O line has a large load during the tri-state I/O control, the ability to drive data from the semiconductor device 10 to the controller 100 may be degraded. In other words, there may be difficulties in transferring data from the semiconductor device 10 to the controller 100.

Furthermore, when the controller 100 reads data from the semiconductor device 10, the controller 100 may transmit the reference signal for synchronization to the semiconductor device 10, the output buffer of the controller 100 may be turned off to receive data of the semiconductor device 10, and the semiconductor device 10 may receive the reference signal and transmit data. In this case, when this process requires a long time, the period in which power is not supplied to the semiconductor device 10 may be increased to make it difficult to retain the operating voltage VDD.

In order to solve the above-described problems, the system according to the embodiment of the present invention may always retain the potential of the I/O line at a high level in most of the time, and generate a pulse signal with a narrow width and small level change at a data transition time point, in order to perform communication. According to the above-described embodiment, the controller 100 and the semiconductor device 10 may be configured to have a protocol for stably retaining the operating voltage VDD and recovering a pulse signal with a narrow width and small level change to data.

Furthermore, during a read operation requiring synchronization, the controller 100 and the semiconductor device 10 may measure the voltage level of a pulse signal at the same time, in order to reduce a time delay caused by the synchronization.

The above-described configurations can be implemented by the following embodiments.

Figure 12:
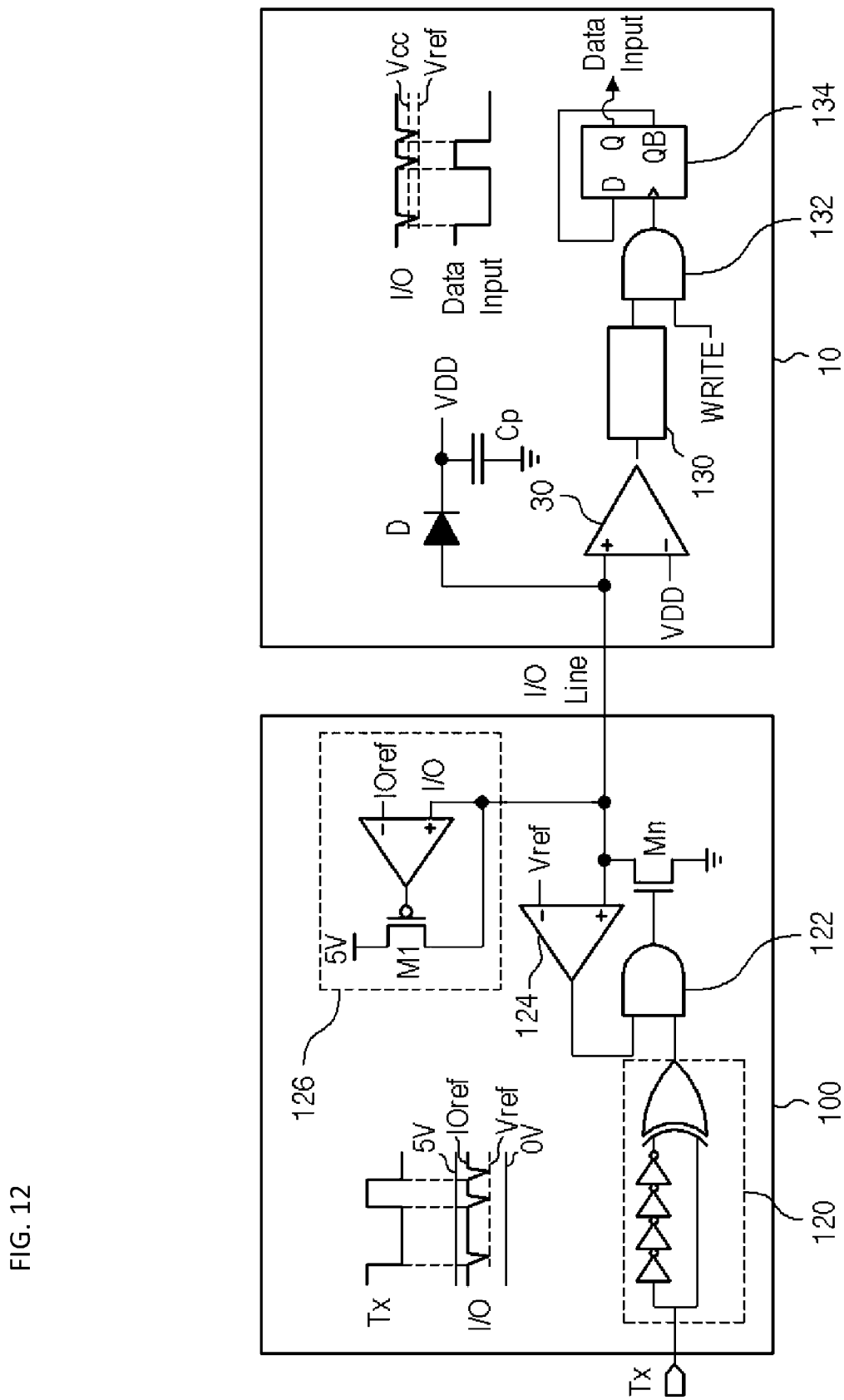
FIG. 12 is a circuit diagram for describing communication between the controller and the semiconductor device during the write operation.

FIG. 12 is a circuit diagram illustrating that the controller 100 writes data to the semiconductor device 10 with two terminals, including waveforms related thereto.

In FIG. 12, the controller 100 and the semiconductor device 10 are configured to communicate with each other through the I/O line.

The controller 100 keeps pulling up the I/O line to retain the I/O line voltage larger than an I/O regulation voltage IOref, and pulls down the I/O line at a transition time point of a transmitted signal Tx when the transmitted signal Tx is inputted. The pull-down operation is stopped when the voltage (pull-down signal) of the I/O line reaches a preset reference voltage Vref. The voltage level of the I/O line is returned by the pull-up operation after the pull-down operation is stopped, and in this way, the controller 100 outputs a pulse signal to the I/O line, the pulse signal being swung by the pull-up and pull-down operations in response to the transmitted signal Tx.

More specifically, the controller 100 includes a pulse generator 120, an I/O voltage regulator 126 and a pull-down control unit. The pulse generator 120 is configured to generate a pulse corresponding to a transition time point of the transmitted signal Tx when the transmitted signal Tx is inputted, the I/O voltage regulator 126 is configured to pull up the I/O line to retain the I/O line voltage larger than the I/O regulation voltage IOref, and the pull-down control unit is configured to pull down the I/O line in response to a high-level signal of the pulse generator 120, and stop the pull-down operation when the voltage (pull-down signal) of the I/O line reaches the preset reference voltage Vref.

After the pull-down operation is stopped, the voltage level of the I/O line is returned by the pull-up operation, and in this way, the pulse signal which is swung by the pull-up and pull-down operations in response to the transmitted signal Tx is outputted to the I/O line.

The pull-down control unit may include a transistor Mn, an AND gate 122 and a comparator 124. The transistor Mn pulls down the I/O line, the AND gate 122 turns on the transistor Mn to perform a pull-down operation when a high-level signal is inputted from the pulse generator 120, and the comparator 124 controls the AND gate 122 to stop the pull-down operation when the voltage of the I/O line reaches the preset reference voltage Vref through the pull-down operation.

The semiconductor device 10 performs a power charging and write mode using the pulse signal.

For the write mode, the semiconductor device 10 may include an input buffer 30, a pulse generation circuit 130, and a toggle flip-flop 134. The input buffer 30 compares the pulse signal to a preset comparison voltage (VDD, for example) and provides a signal corresponding to a comparison result between the pulse signal and the comparison voltage, the pulse generation circuit 130 outputs a pulse having a transition time point synchronized with the output of the input buffer 30, and the toggle flip-flop 134 recovers data having the same phase as the transmitted signal Tx using the pulse of the pulse generation circuit 130.

For the power charging, the semiconductor device 10 may include a diode D and a capacitor Cp. The diode D has first and second pins and receives a signal containing a pulse signal through the I/O line connected to one pin of the first and second pins, and the capacitor Cp is charged with the signal transferred by the diode D and generates the operating voltage VDD.

According to the above-described configuration, when the transmitted signal Tx is inputted as an UART signal from an external device, the controller 100 detects a high-to-low or low-to-high transition point of the transmitted signal Tx, and generates a pulse.

The pulse generation in response to the transmitted signal Tx may be performed by the pulse generator 120. The pulse generator 120 may generate the pulse by performing an XOR operation on the transmitted signal Tx and a signal obtained by delaying the transmitted signal Tx by a preset time.

When the pulse generated by the pulse generator 120 is provided to the AND gate 122 and a high-level signal is inputted from the pulse generator 120, the AND gate 122 turns on the NMOS transistor Mn, and the I/O line is pulled down by the turn-on of the transistor Mn.

The pull-down of the I/O line is maintained until the voltage level of the I/O line reaches the reference voltage Vref applied to the comparator 124.

When the voltage level of the I/O line or the pull-down signal reaches the reference voltage Vref applied to the comparator 124, the pull-down of the I/O line is stopped, and the voltage level of the I/O line is returned to the original high level by the operation of the I/O voltage regulator 126 as soon as the pull-down is stopped. The I/O voltage regulator 126 performs a regulation operation such that the voltage level of the I/O line is retained at the preset I/O regulation voltage IOref or more.

The controller 100 repeatedly performs the above-described operation at each transition point of the transmitted signal Tx. As a result, the controller 100 may output a triangle wave pulse signal in response to the transmitted signal Tx, the triangle wave pulse signal swinging between the reference voltages IOref and Vref. At this time, the reference voltage Vref may be set to a level between the I/O regulation voltage IOref and the ground voltage, and the set value may be selected according to a designer's intention.

The semiconductor device 10 with two pins receives a signal containing the triangle wave pulse signal through the I/O line, and generates the operating voltage VDD through a rectification operation of the diode D and the capacitor Cp. At this time, the signal of the I/O line always retains a high level except for a short period in which a triangle wave is present. Thus, the semiconductor device 10 can stably retain the operating voltage VDD, and generate a high-quality operating voltage VDD from which glitch noise is filtered, depending on the capacity of the capacitor.

On the other hand, the signal transferred to the semiconductor device 10 through the I/O line is provided to the comparator-type input buffer 30.

The input buffer 30 compares a comparison voltage and the signal of the I/O line, and provides a signal corresponding to a comparison result between the comparison voltage and the signal of the I/O line to the pulse generation circuit 130, the comparison voltage indicating a reference voltage corresponding to a level at which the triangle wave pulse can be recognized (VDD, for example).

The pulse generation circuit 130 provides a pulse having a transition point synchronized with the output of the input buffer 30 to the AND gate 132, in response to the output of the input buffer 30.

In the write mode, the AND gate 132 can transfer the pulse of the pulse generation circuit 130 to the toggle flip-flop 134, and the toggle flip-flop 134 can recover data having the same phase as the signal Tx transmitted to the controller 100.

When an unexpected glitch signal is generated on the communication path while the communication using a pulse is performed as illustrated in FIG. 12, the data outputted from the toggle flip-flop 134 may be inverted.

Figure 13:
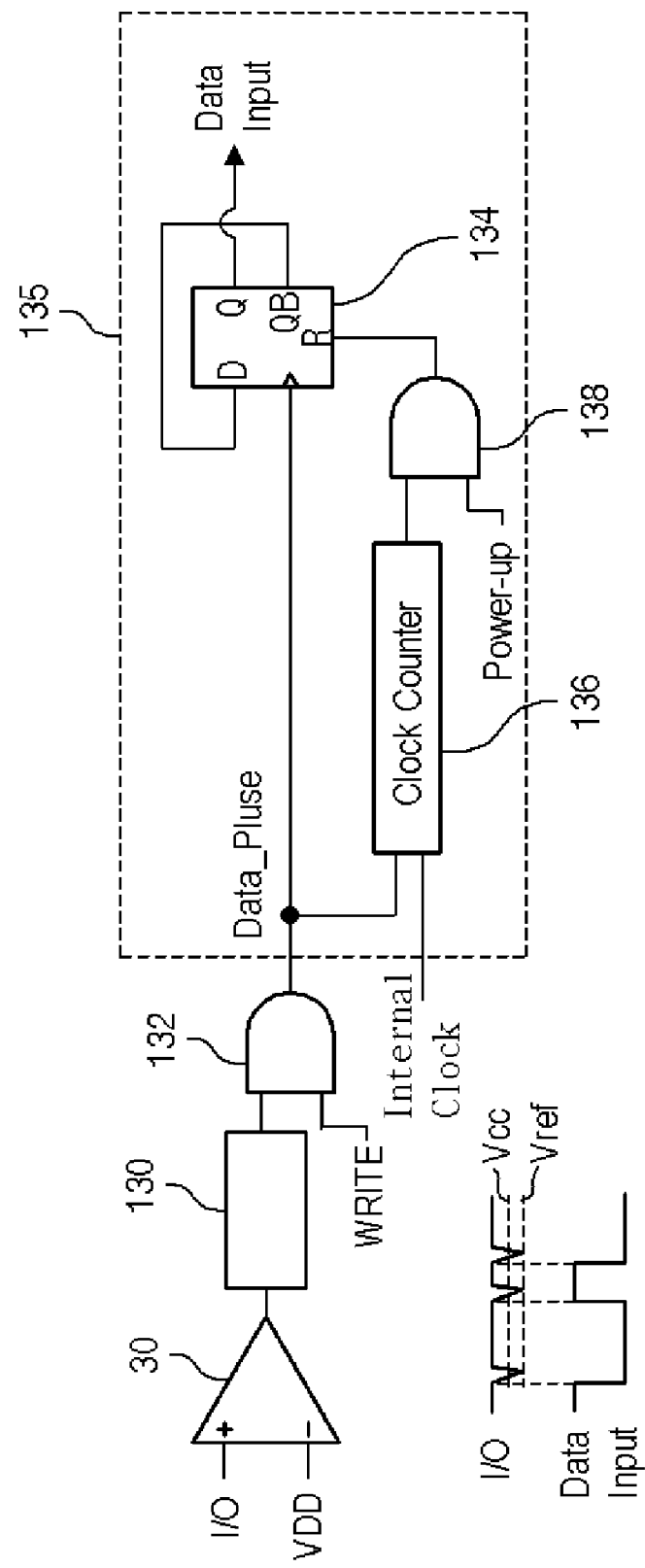
FIG. 13 is a circuit diagram illustrating a circuit configured by applying an error prevention circuit to the circuit of FIG. 12.

In order to prevent the above-described error, the present invention may be embodied as illustrated in FIG. 13. Referring to FIG. 13, when power is turned on at the initial stage (power-up state) or when no pulses are inputted during a cycle corresponding to a preset maximum number of bits, the toggle flip-flop 134 can be automatically reset in order to prevent a communication error which may be caused by a glitch signal. The maximum number of bits may be set to nine corresponding to the maximum reference communication bit number of the UART communication.

For the above-described error prevention operation, the semiconductor device 10 according to the embodiment of FIG. 13 may include a clock counter 136 and an AND gate 138, and the clock counter 136 and the AND gate 138 may be grouped to be an error prevention circuit.

The clock counter 136 performs a count operation using a clock signal generated therein, and counts until the preset maximum number of bits. When a pulse Data Pulse is inputted from the AND gate 132 during the counting operation, the clock counter 136 is reset. Furthermore, when the counting operation for the preset maximum number of bits is completed, the clock counter 136 provides a high-level signal corresponding to the counter output to the AND gate 138.

When the clock counter 136 counts the preset maximum number of bits in the power-up state, the AND gate 138 resets the toggle flip-flop 134.

Figure 14:
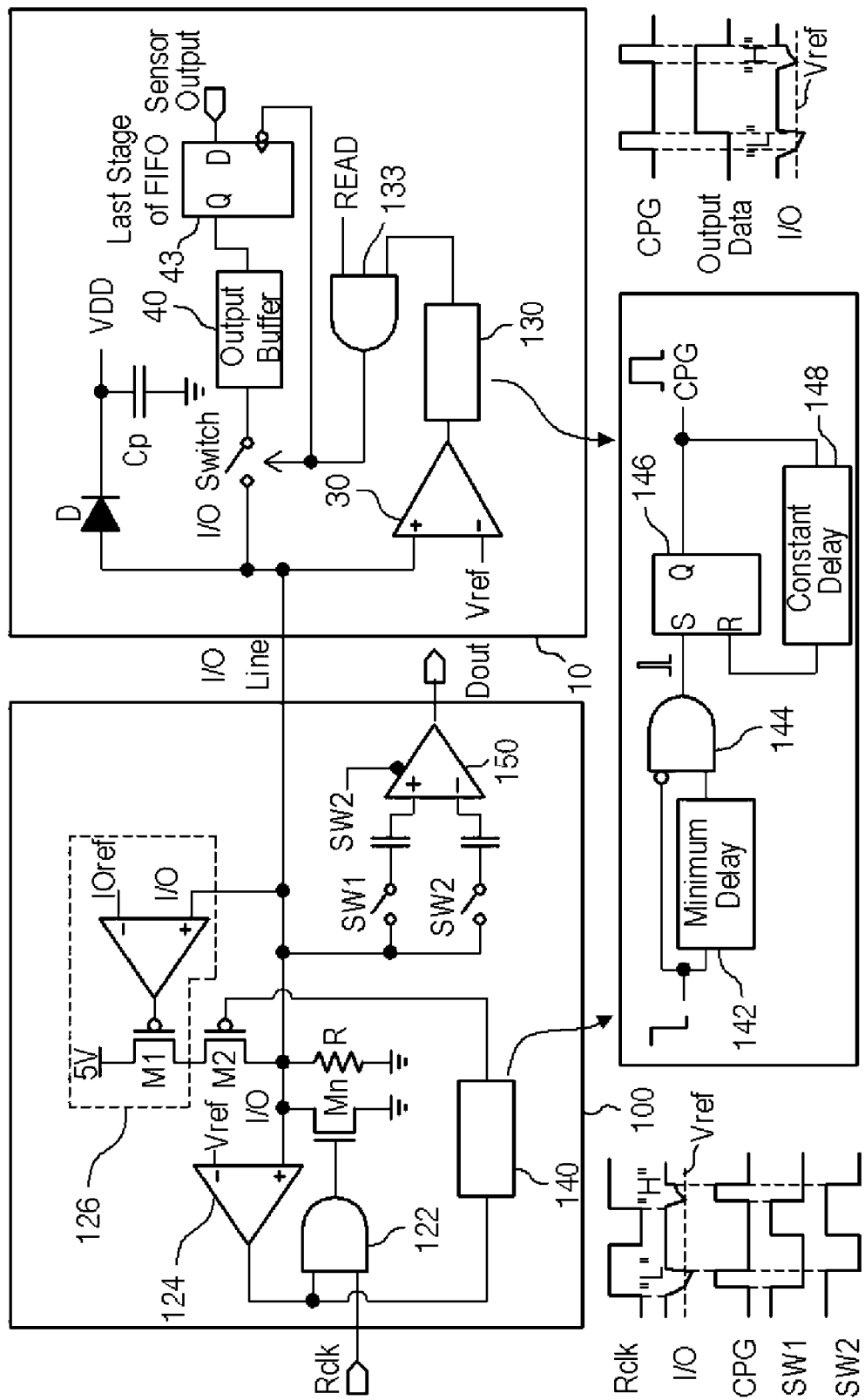
FIG. 14 is a circuit diagram for describing communication between the controller and the semiconductor device during the read operation.

FIG. 14 is a circuit diagram illustrating that the controller 100 reads data from the semiconductor device 10 with two pins, including waveforms related thereto. FIG. 14 illustrates an embodiment which further includes a circuit for a read operation, compared to the embodiments of FIGS. 12 and 13.

In FIG. 14, pulse generation circuits 130 and 140 included in the controller 100 and the semiconductor device 10 may be implemented with a constant pulse generator. The pulse generation circuits 130 and 140 can generate a pulse with a constant width, and prevent a misrecognition which may occur when one input is recognized as two or more inputs due to glitch noise.

Referring to FIG. 14, an operation of the embodiment corresponding to data read will be described.

When a read command is contained in a signal Tx transmitted from outside, the controller 100 and the semiconductor device 10 perform a read operation, and the controller 100 activates a predetermined number of read clocks Rclk.

The I/O line may be pulled down at a point of time that a read clock Rclk is changed to a high level by the controller 100. The pull-down of the I/O line may be controlled depending on an output of the comparator 124. When the voltage level of the I/O line reaches the reference voltage Vref, the output of the comparator 124 may be inverted. Thus, the pull-down operation for the I/O line is stopped.

Simultaneously, the pulse generation circuit 140 receiving the output of the comparator 124 generates a pulse with a constant width. The constant-width pulse outputted from the pulse generation circuit 140 turns off a PMOS transistor M2. The turn-off of the PMOS transistor M2 indicates that the I/O voltage regulator 126 and the I/O line are isolated from each other. As a result, the I/O line is set in a floating state that only a termination resistor R is present.

When the semiconductor device 10 outputs data to the I/O line while the I/O line is floated as described above, the voltage of the I/O line can be changed. The voltage change of the I/O line can be sensed by a double sampling difference amplifier 150 of the controller 100. When the pulse provided from the pulse generation circuit 140 is ended, the double sampling difference amplifier 150 latches the sensed signal.

The double sampling difference amplifier 150 samples voltages in capacitors at the positive terminal (+) and negative terminal (−) thereof through sequential switching operations of switches SW1 and SW2, respectively, the voltages corresponding to the time points that the pulse provided from the pulse generation circuit 140 is started and ended. The double sampling difference amplifier 150 outputs a comparison result between the sampled voltages as read data Dout.

The termination resistor R may be calibrated to a value suitable for sensing data outputted from the semiconductor device 10, and noise introduction through the I/O line can be reduced by the calibration of the termination resistor R. That is, the resistance value of the termination resistor R may be decreased when the output of sampling difference of the controller 100 tends to be high, and increased when the output of sampling difference of the controller 100 tends to be low. In this way, the sampled values can be adjusted to achieve the balance.

On the other hand, when the I/O line is pulled down and floated at a point of time at which the read clock Rclk is changed to a high level by the controller 100, the pulse generation circuit 130 of the semiconductor device 10 outputs a constant-width pulse according to a changed output of the input buffer 30.

At this time, the input buffer 30 may be configured to decide the output using the same reference voltage Vref as that applied to the comparator 124 of the controller 100. Based on a point of time at which the output level of the input buffer 30 changes from high to low, the pulse generation circuit 130 outputs a pulse retaining a high level for a predetermined time.

The I/O switch is turned on while the pulse of the pulse generation circuit 130 is retained at a high level after the read mode is enabled by an output of the AND gate 133. That is, data outputted through the output buffer 40 may be transferred to the controller 100 during this period.

Furthermore, a flip-flop 43 installed at the last stage of the FIFO memory 42 is shifted in synchronization with a point of time that the pulse of the pulse generation circuit 130 transitions to a low level, and data outputted from the final stage of the FIFO memory 42 by the shifting of the flip-flop 43 are transferred to the controller 100 through the output buffer 40 and the I/O switch.

In the above-described configuration, each of the pulse generation circuits 130 and 140 installed in the controller 100 and the semiconductor device 10 may include a delay unit 142, an AND gate 144, an SR flip-flop 146 and a constant delay 148.

The delay unit 142 delays an input signal by a preset value. The AND gate 144 generates a pulse by performing an AND operation on an output of the delay unit 142 and a signal obtained by inverting an input of the pulse generation circuit 130 or 140. The SR flip-flop 146 receives the pulse of the AND gate 144 as the set signal, and receives a signal of the constant delay 148 as the reset signal. The SR flip-flop 146 is triggered by the set signal, and outputs a pulse having a delay time decided by the constant delay 148. The constant delay 148 provides a signal for resetting the SR flip-flop 146 in response to a change in output of the SR flip-flop 146, and controls the SR flip-flop 146 to output a constant-width pulse.

In the above-described configuration, the delay unit 142 may have a delay value set to the minimum value, such that the AND gate 144 can output a pulse having the minimum width which can be recognized by the SR flip-flop 146.

As described above, the semiconductor device 10 controls the pulse generation circuit 130 to generate a pulse with a predetermined width as soon as the I/O line reaches the reference voltage Vref, and turns on the I/O switch to output data stored in the FIFO memory 42 to the I/O line during a high period of the pulse outputted from the pulse generation circuit 130.

At this time, the semiconductor device 10 and the controller 100 generate the constant-width pulse using the same reference voltage Vref. Therefore, when the delay of the I/O line is ignored, the semiconductor device 10 and the controller 100 can generate the constant-width pulse almost at the same time. This indicates that the synchronization for tri-state I/O control is achieved. Therefore, the present embodiment can prevent an additional delay for synchronization, and increase the baud rate of the data.

Furthermore, since a pulse with a small swing and short time span is transmitted through the I/O line, the power consumption can be reduced.

The pulse generation circuits 130 and 140 can prevent a generation of two or more pulse signals for one level transition due to glitch noise, using the minimum delay of the delay unit 142. The pulses outputted from the pulse generation circuits 130 and 140 of the controller 100 and the semiconductor device 10 may preferably have the same width. However, in the condition that the delay of the I/O line should be considered, the pulse width of the pulse generation circuit 140 of the controller 100 may be increased to meet the condition.

Figure 15:
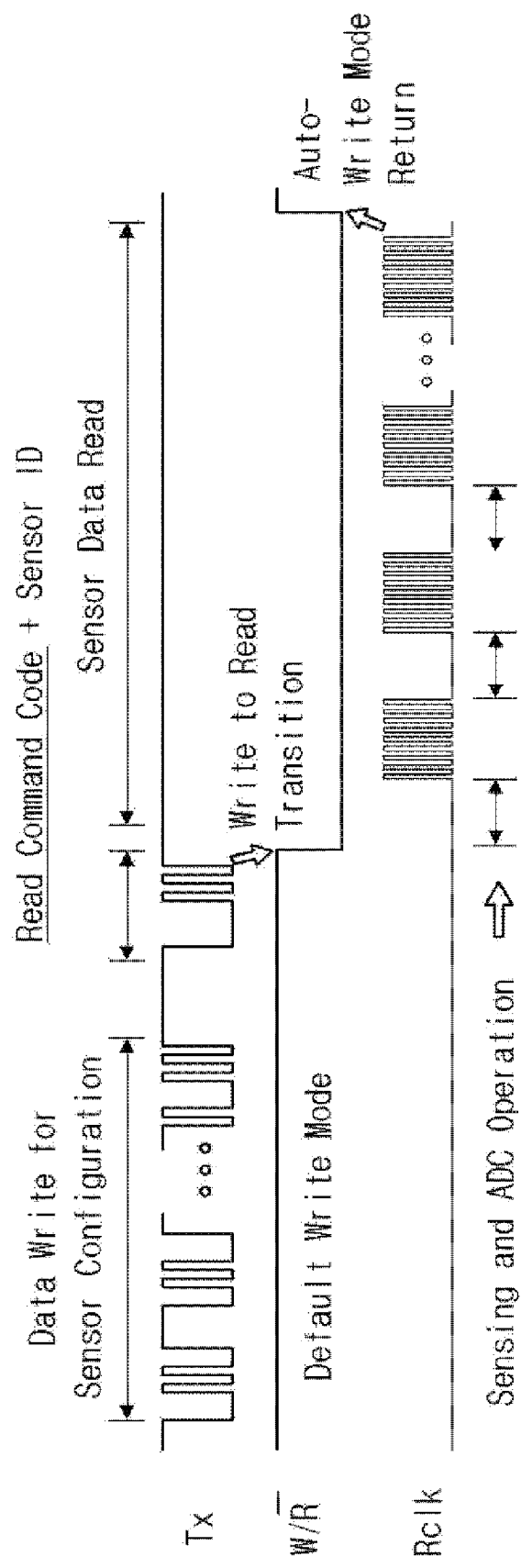
FIG. 15 is a waveform diagram illustrating a protocol for a transmitted signal, read clock and mode signal.

In the present embodiment, a transmitted signal Tx, a read clock Rclk and a mode signal W/R which have a protocol illustrated in FIG. 15 may be used in order to perform the read mode.

Referring to FIG. 15, the transmitted signal Tx may include data which may be written to the semiconductor device 10, a read command code for controlling the read mode, and a code for identifying the semiconductor device 10.

The mode signal W/R may have a waveform that retains a high level by default in the write mode, changes to a low level in the read mode, and returns to the write mode after the read mode is ended.

The read clock Rclk may have a waveform in which periods for accessing sensors and periods for data output conversion are separately formed in response to the read mode. When data are outputted from the semiconductor device through this method, data formed in the semiconductor device can be directly outputted, which makes it possible to reduce the needed size of the output buffer memory. Furthermore, it is possible to prevent an introduction of I/O noise of data conversion in the sensing process which is sensitive to noise.

Figure 16:
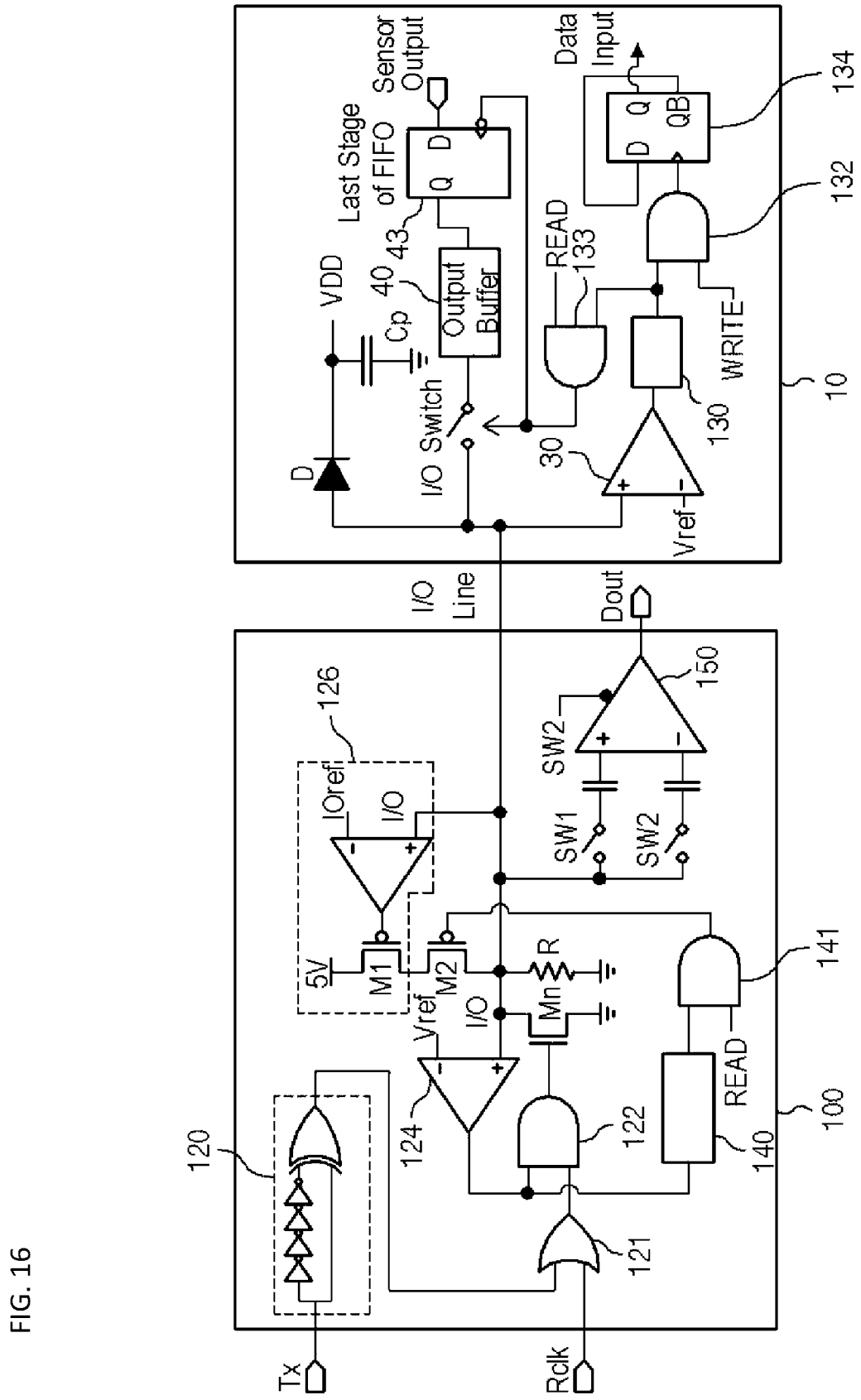
FIG. 16 is a circuit diagram for describing communication between the controller and the semiconductor device during the write and read operations.

FIG. 16 is a circuit diagram illustrating an integrated circuit for performing write and read operations according to an embodiment of the present invention. FIG. 16 illustrates a configuration obtained by integrating the configurations of FIGS. 12 and 14, and the circuit of FIG. 16 further includes an OR gate 121 configured to transfer the transmitted signal Tx of FIG. 12 and the read clock Rclk of FIG. 14.

Therefore, an output of the AND gate 122 is changed in response to a pulse corresponding to the transmitted signal Tx or the read clock Rclk transferred through the OR gate 121.

The semiconductor device 10 with two terminals may provide two different operation methods depending on a voltage characteristic. This is related to the voltage decision method and the structural shape of the two-terminal CMOS component. That is, a voltage applied to the two-terminal CMOS component is decided by a potential difference between the two terminals. Therefore, when the VF terminal of the two terminals is fixed to the ground voltage VSS and a pull-down pulse is applied to the VB terminal or when the VB terminal is fixed to an external voltage and a pull-up signal is applied to the VF terminal, the operations at these conditions may be considered as the same operation from the viewpoint of the semiconductor device 10.

Figure 17:
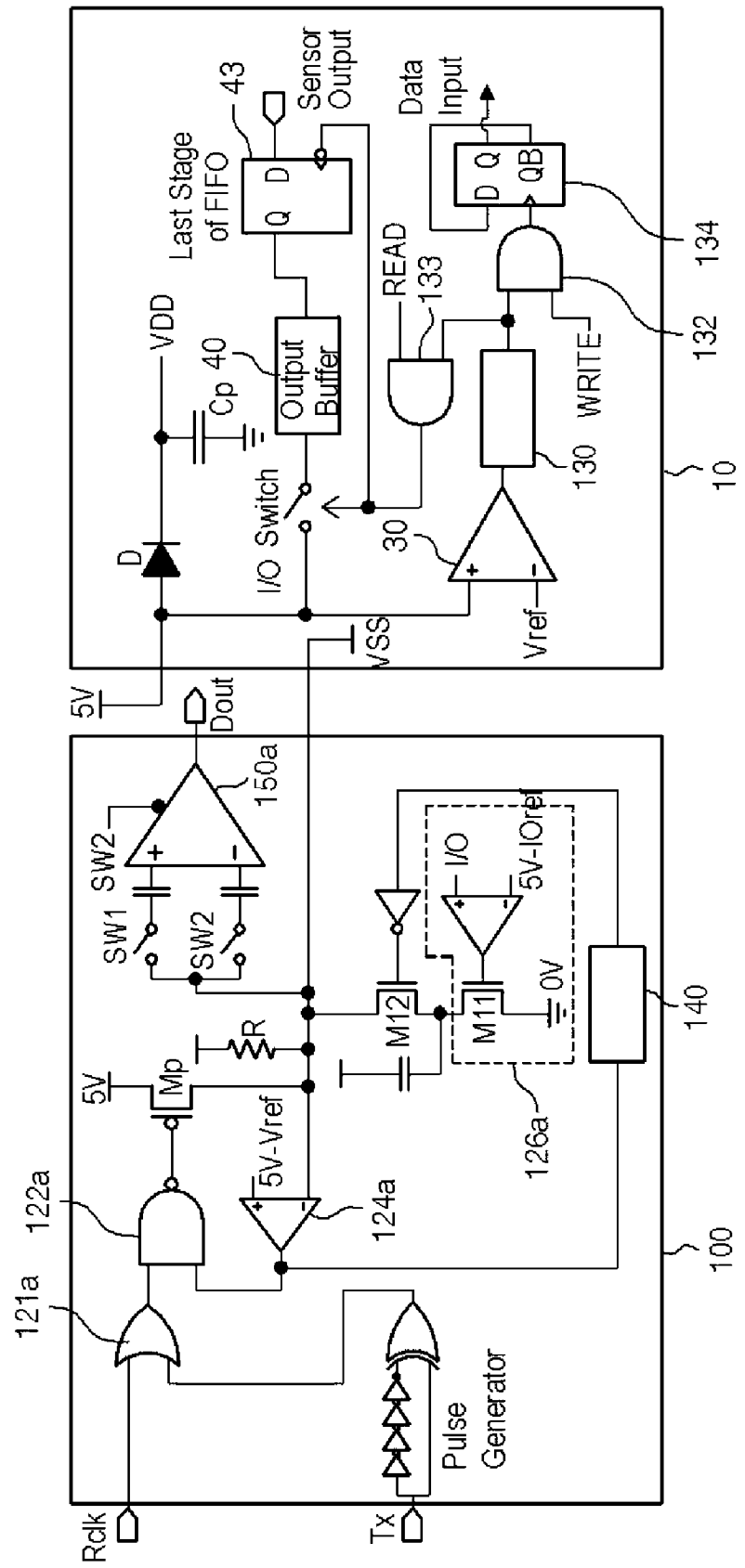
FIG. 17 is a circuit diagram illustrating another embodiment of the present invention.

FIG. 17 illustrates that the voltage level of the I/O line of the controller 100 is reversely set. That is, when it is assumed that the external voltage of the controller 100 is 5V, an operation range may be defined as a voltage range between 5V and the I/O regulation voltage IOref, and the level of the I/O line may be regulated to "5V-I/O regulation voltage IOref".

When the read clock Rclk or the transmitted signal Tx corresponding to an UART signal is inputted to the controller 100 from an external device, an output of the NAND gate 122a is changed in response to a pulse corresponding to the transmitted signal Tx or the read clock Rclk transferred through the OR gate 121a.

More specifically, the controller 100 senses a high-to-low or low-to-high transition of the transmitted signal Tx or the read clock Rclk, using a NAND gate 122a. The NAND gate 122a generates a pulse for pulling up the I/O line in response to a transition point of the transmitted signal Tx or the read clock Rclk, and a PMOS transistor Mp pulls up the I/O line in response to the output of the NAND gate 122a.

When the voltage (pull-up signal) of the I/O line is raised to more than "5V-Vref" by the pull-up operation, the output of the comparator 124a changes from a high level to a low level, and the pull-up operation is stopped by the output of the NAND gate 122a corresponding to the comparator output change. The I/O line has a voltage regulator 126a installed thereon, and the voltage regulator 126a returns the voltage level of the I/O line to "5V-I/O regulation voltage IOref" after the pull-up operation is stopped. Therefore, the controller 100 of FIG. 17 may output a triangle wave pulse having an amplitude of "5V-IOref" to "5V-Vref" through the I/O line in response to the transmitted signal Tx or the read Rclk received from the external device.

In FIG. 17, the I/O line is connected to one terminal to which the first supply voltage VF (represented by VSS in FIG. 17) is applied, between the two terminals of the semiconductor device 10, and the fixed voltage of 5V is connected to the other terminal of the semiconductor device 10.

The write and read operations of the controller 100 in FIG. 17 can be understood by analogy through the descriptions of the previous embodiments, even though the controller 100 has a different configuration from the circuit of FIG. 16. Therefore, the duplicated descriptions are omitted herein. However, one difference of the controller 100 of FIG. 17 to notice is that a signal voltage of the I/O line is inverted during a read operation, compared with the configuration of FIG. 16. Therefore, data transmitted from the semiconductor device 10 need to be inverted in this configuration.

In other words, the semiconductor device 10 according to the embodiment of FIG. 17 is configured and operated in the same manner as the previous embodiments, except that the level of the I/O line is reversely set. Thus, the duplicated descriptions are omitted therein.

Figure 18:
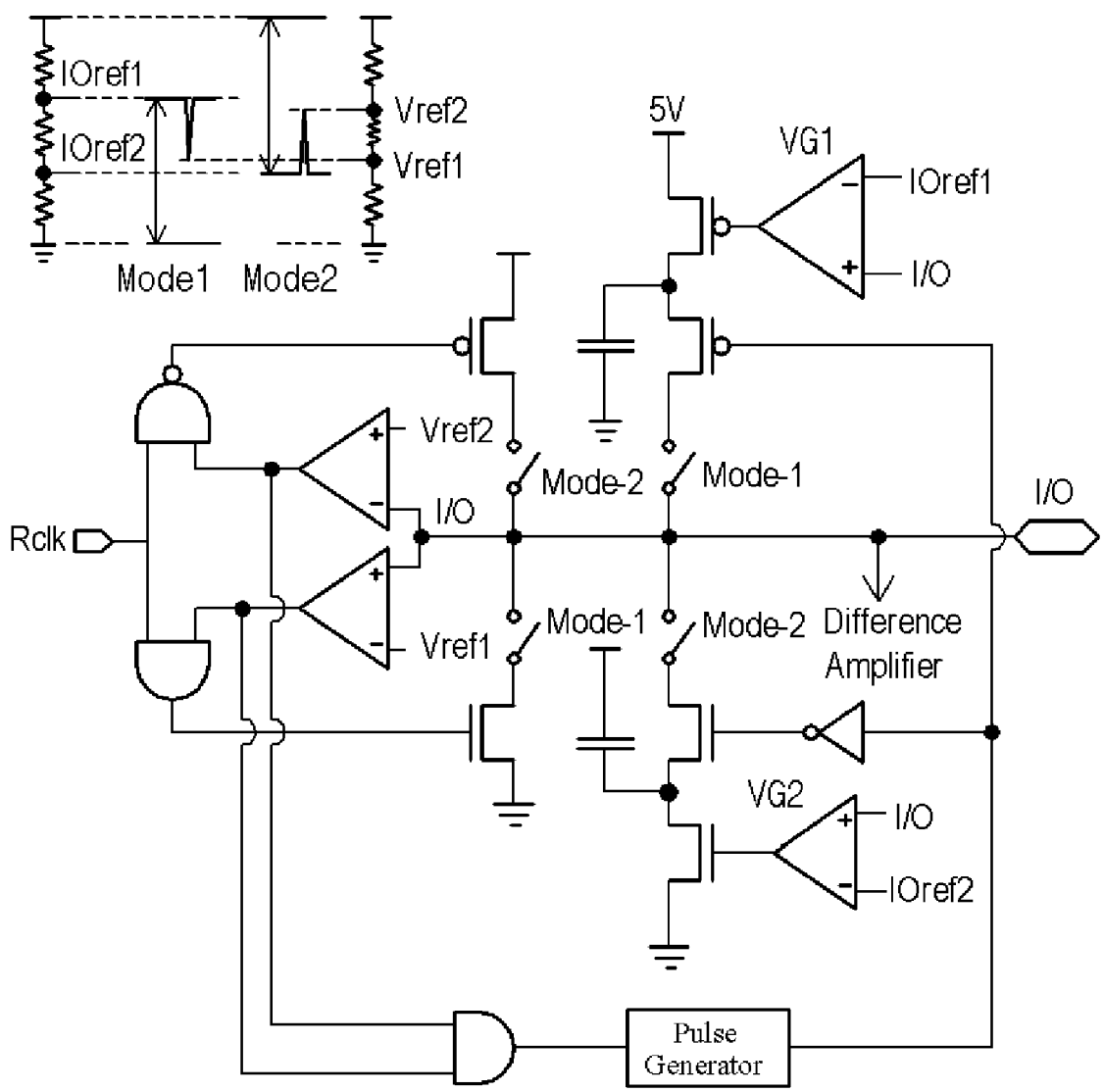
FIG. 18 is a circuit diagram illustrating a configuration in which the polarity of a driving voltage of an I/O line of a controller according to the embodiment of the present invention can be selected.

FIG. 18 illustrates a configuration in which the controller 100 according to the embodiment of FIG. 16 and the controller 100 according to the embodiment of FIG. 17 are implemented into one controller. The embodiment of FIG. 18 requires mode selection switches Mode-1 and Mode-2 which can select the mode of FIG. 16 and the mode of FIG. 17.

The mode of FIG. 16 may be defined as a normal mode, and the mode of FIG. 17 may be defined as a reverse mode.

FIG. 18 simply illustrates only a circuit related to the pull-up and pull-down operations of the I/O line, including only the read clock Rclk. The embodiment of FIG. 18 includes the mode selection switches Mode-1 and Mode-2 for mode switching. In FIG. 18, reference numerals of the components illustrated in FIGS. 16 and 17 and the descriptions of the configurations and operations thereof are omitted.

In FIG. 18, the controller 100 performs the normal mode when the mode selection switch Mode-1 is turned on, and performs the reverse mode when the mode selection switch Mode-2 is turned on.

Figure 19:
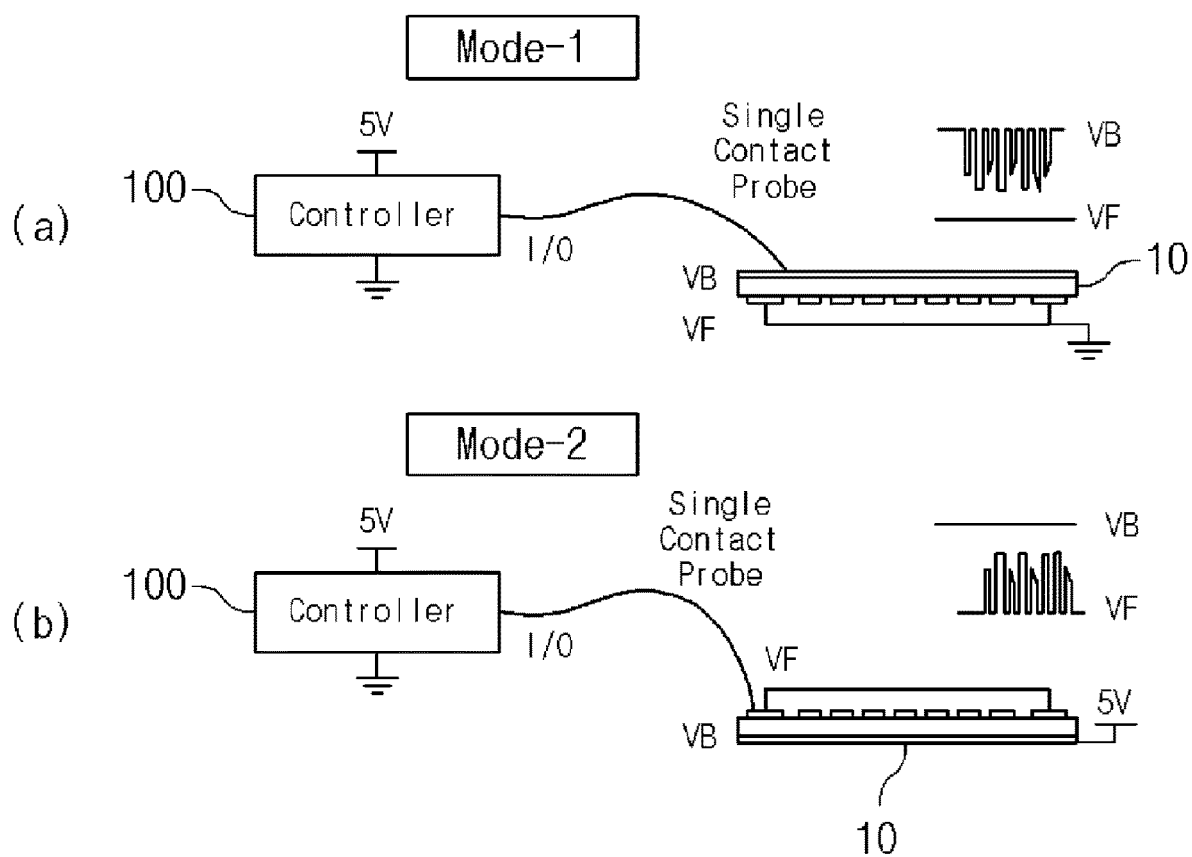
FIGS. 19A and 19B illustrate configurations for modes when the polarity of the driving voltage of the I/O line of the controller according to the embodiment of the present invention is varied.

When the controller 100 is configured as illustrated in FIG. 18, the controller 100 may be operated in response to a semiconductor device 10 in which data I/O and the first supply voltage VF of the front side share one terminal as illustrated in FIG. 19A, or operated in response to a semiconductor device 10 in which data I/O and the second supply voltage VB of the back side share one terminal as illustrated in FIG. 19B. Therefore, the controller 100 of FIG. 18 can measure various semiconductor devices 10 by changing the mode.

For reference, FIGS. 19A and 19B illustrate that the semiconductor device 10 includes a plurality of electrodes (sensor electrodes) formed on one surface thereof, a ring-shaped terminal formed around the electrodes, and another terminal formed on the other surface thereof.

As illustrated in FIG. 19A, a narrow pulse with an amplitude of which the voltage level falls is generated in the I/O line in response to write or read data in the normal mode corresponding to FIG. 16. Furthermore, as illustrated in FIG. 19B, a narrow pulse with an amplitude of which the voltage level rises is generated in the I/O line in response to write or read data in the reverse mode corresponding to FIG. 17.

The controller 100 senses the change of the I/O line as data through the double sampling difference amplifier 150 or 150a during a read operation, and generates a received signal Rx by adding a start bit and stop bit to the data.

According to the above-described configuration, the semiconductor device with two terminals using the two-terminal CMOS component can be implemented, and one terminal of the two terminals of the semiconductor device may be shared for data communication and power source. Therefore, the semiconductor device can perform asynchronous serial communication. That is, the semiconductor device can write and read data using the shared terminal.

The semiconductor device may have a rectification function for acquiring a supply voltage from the data.

Furthermore, since the semiconductor device with two terminals generates the reference clock for asynchronous serial communication, the semiconductor device can write data using the reference clock.

Moreover, since the energy loss and the sizes of the internal circuits can be minimized, data information generated from the semiconductor device can be stably transferred to the external controller.

Furthermore, since the controller can transfer data using a short period pulse and the semiconductor device can recover the transferred data using the short period pulse, it is possible to not only increase the efficiency of the rectification function using data, but also implement the asynchronous serial communication technology capable of removing an error during the data transfer process.

Depending on code information contained in data, the system according to the present embodiment can determine the read mode and the write mode.

The system according to the present embodiment can generate a timing for determining a high or low state of data inputted through the asynchronous serial method in the write mode, using the baud rate of the inputted data.

Therefore, when the data contains a code indicating the read mode, the semiconductor device with two terminals may generate a clock signal corresponding to the baud rate, receive data from the internal data formation unit using the clock signal, and return to the write mode after receiving the data. The internal data formation unit may indicate the element array including one or more of the sensor element and memory element which are implemented with the CMOS component.

Furthermore, the system according to the present embodiment can generate an output of the internal data formation unit in synchronization with the reference pulse signal transferred from the external controller in the read mode, and load the output to the I/O terminal with one line such that the external controller can sense and determine the output.

When the internal data formation unit outputs data, the system according to the present embodiment can alternately perform the operation of transmitting data from the CMOS circuit to the output buffer and the operation of transmitting data from the output buffer to the outside. Therefore, the size of the output buffer required for the semiconductor device can be reduced.

Furthermore, since one terminal which is selected between two terminals of the semiconductor device depending on the mode is shared for data communication and power source, the semiconductor device can be utilized flexibly in various purposes.

While various embodiments have been described above, it will be understood to those skilled in the art that the embodiments described are by way of example only. Accordingly, the disclosure described herein should not be limited based on the described embodiments.

The invention claimed is:

1. An asynchronous serial communication system comprising:
    a controller configured to control pull-up and pull-down operations for an I/O line, and output a pulse signal to the I/O line, the pulse signal swinging between an I/O voltage and a reference voltage for controlling the pull-up and pull-down operations and corresponding to a transition time point of a signal transmitted from outside; and
    a semiconductor device configured to perform charging of an internal power source and data input using the pulse signal,
    wherein the controller comprises:
        a pulse generator configured to generate a pulse corresponding to the transition time point of the transmitted signal when the transmitted signal is inputted;
        an I/O voltage regulator configured to control the I/O line to retain the I/O voltage; and
        a control unit configured to control the I/O line to retain the I/O voltage, perform of any one of pull-up or pull-down operations for the I/O line at the transition time point of the transmitted signal when the transmitted signal is inputted, and stop the pull-up or pull-down operations when the voltage of the I/O line reaches a preset reference voltage, and
    wherein the voltage level of the I/O line returns to the I/O voltage after the pull-up or pull-down operation is stopped, and the pulse signal swinging between the I/O voltage and the reference voltage is outputted to the I/O line in response to the transmitted signal.

2. An asynchronous serial communication system comprising:
    a controller configured to control pull-up and pull-down operations for an I/O line, and output a pulse signal to the I/O line, the pulse signal swinging between an I/O voltage and a reference voltage for controlling the pull-up and pull-down operations and corresponding to a transition time point of a signal transmitted from outside; and
    a semiconductor device configured to perform charging of an internal power source and data input using the pulse signal,
    wherein the semiconductor device comprises, for the data input:
        an input buffer configured to compare the pulse signal to a preset comparison voltage and provide a signal corresponding to a comparison result between the pulse signal and the comparison voltage;
        a pulse generation circuit configured to output a pulse having a transition time point synchronized with the output of the input buffer; and
        a toggle flip-flop configured to recover the output data to have the same phase as the transmitted signal using the pulse.

3. The asynchronous serial communication system of claim 2, further comprising an error prevention circuit configured to reset the toggle flip-flop when a period in which the pulse of the pulse generation circuit is not generated exceeds a preset time or in case of a power-up state.

4. A semiconductor device comprising:
    an input buffer configured to receive a pulse signal from a controller through an I/O line in response to a transition time point of a signal transmitted from outside, the pulse signal swinging between preset first and second voltages, compare the pulse signal to a preset comparison voltage, and provide a signal corresponding to a comparison result between the pulse signal and the comparison voltage;
    a pulse generation circuit configured to output a pulse having a transition time point synchronized with an output of the input buffer; and
    a toggle flip-flop configured to recover the output data to have the same phase as the transmitted signal using the pulse.

5. The semiconductor device of claim 4, further comprising an error prevention circuit configured to reset the toggle flip-flop when a period in which the pulse of the pulse generation circuit is not generated exceeds a preset time or in case of a power-up state.

6. An asynchronous serial communication system comprising:
    a controller having an I/O voltage regulator for controlling an I/O line to retain an I/O voltage, and configured to perform any one of pull up or pull down operations for the I/O line, stop the pull-up or pull-down operation to generate a first constant pulse when a pull-up signal or pull-down signal reaches a predetermined first reference voltage, float the I/O line while the first constant pulse is enabled, and sense data when the data are transferred to the floated I/O line; and
    a semiconductor device configured to generate a second constant pulse when the pull-up signal or the pull-down signal of the I/O line reaches the second reference voltage, and output read data through the I/O line while the second constant pulse is enabled.

7. The asynchronous serial communication system of claim 6, wherein the controller further comprises:
    a first switch turned on at a point of time that the first constant pulse is enabled, and sampling the data of the I/O line;

a second switch turned on at a point of time that the first constant pulse is disabled, and sampling the data of the I/O line; and a double sampling difference amplifier configured to output a comparison result between the voltages sampled by the first and second switches as the read data.

8. The asynchronous serial communication system of claim 6, wherein the semiconductor device comprises:

an input buffer configured to detect whether the pull-down voltage or pull-up voltage for the I/O line has reached the second reference voltage;

a pulse generation circuit configured to generate the second constant pulse having an enable period with a constant width, when the pull-down voltage or pull-up voltage for the I/O line reaches the second reference voltage; and a switch configured to output the read data through the I/O line while the second constant pulse is enabled.

9. The asynchronous serial communication system of claim 6, wherein the controller and the semiconductor device sense the first and second reference voltages at the same level, and uses the sensed timing for synchronization of I/O control between the controller and the semiconductor device.

10. The asynchronous serial communication system of claim 6, further comprising a variable resistor between the I/O line and a power line, in order to accurately sense high and low levels of the data transferred to the I/O line from the semiconductor device when the I/O line is floated.

* * * * *